(12) United States Patent
Cheng et al.

(10) Patent No.: US 9,806,153 B1
(45) Date of Patent: Oct. 31, 2017

(54) CONTROLLING CHANNEL LENGTH FOR VERTICAL FETS

(71) Applicant: International Business Machines Corporation, Armonk, NY (US)

(72) Inventors: Kangguo Cheng, Schenectady, NY (US); Ruilong Xie, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/428,712

(22) Filed: Feb. 9, 2017

(51) Int. Cl.
  *H01L 29/10* (2006.01)
  *H01L 29/78* (2006.01)
  *H01L 21/3065* (2006.01)
  *H01L 29/66* (2006.01)

(52) U.S. Cl.
  CPC ...... *H01L 29/1033* (2013.01); *H01L 21/3065* (2013.01); *H01L 29/6656* (2013.01); *H01L 29/66795* (2013.01); *H01L 29/785* (2013.01); *H01L 29/7827* (2013.01)

(58) Field of Classification Search
  CPC ............. H01L 29/1033; H01L 21/3065; H01L 29/6656; H01L 29/66795; H01L 29/7827; H01L 29/785; H01L 29/66712; H01L 29/7802
  See application file for complete search history.

(56) References Cited

U.S. PATENT DOCUMENTS

| | | | |
|---|---|---|---|
| 6,436,770 B1 | 8/2002 | Leung et al. | |
| 8,394,664 B2 | 3/2013 | Nicholas et al. | |
| 8,551,848 B2 | 10/2013 | Kerber et al. | |
| 8,569,182 B2 | 10/2013 | Park et al. | |
| 2012/0329268 A1* | 12/2012 | Soda | H01L 21/0337 438/631 |

FOREIGN PATENT DOCUMENTS

| | | |
|---|---|---|
| JP | 3921862 B2 | 8/2000 |
| JP | 2000228528 A | 8/2000 |
| JP | 2006332662 A | 12/2006 |
| JP | 2012004510 A | 1/2012 |
| KR | 100502421 B1 | 3/2005 |
| KR | 20050054025 | 6/2005 |

* cited by examiner

*Primary Examiner* — Walter H Swanson
(74) *Attorney, Agent, or Firm* — Cantor Colburn LLP; David Quinn

(57) ABSTRACT

A vertical-type semiconductor device includes a first source/drain (S/D) region on an upper surface of a semiconductor substrate. A channel region is on an upper surface of the first S/D region, and extends along the vertical axis to define a channel length. A second S/D region is on an upper surface of the channel region, and separates the second S/D region from directly contacting the semiconductor substrate. An electrically conductive gate wraps around all outer surfaces of the channel region. The gate extends along the vertical axis to define a gate length that is less than the channel length. Dielectric gate elements are interposed between an upper surface of the gate and a lower surface of the second S/D region, and are configured to electrically insulate the gate from the second S/D region.

14 Claims, 23 Drawing Sheets

CONTROLLING CHANNEL LENGTH FOR VERTICAL FETS

BACKGROUND

The present invention relates to fabrication methods and resulting structures for semiconductor devices, and more specifically, to controlling the channel length in vertical-type field effect transistors (FETs).

As demands to reduce the dimensions of transistor devices continue, new designs and fabrication techniques to achieve a reduced device footprint are developed. Vertical-type field effect transistors, hereinafter referred to as vertical FETs, have received increased attention because they can provide a reduced FET device footprint while meeting the necessary FET performance requirements in some areas.

SUMMARY

According to a non-limiting embodiment of the present invention, a method of controlling a gate length of a vertical-type semiconductor device comprises forming a semiconductor substrate including a first source/drain (S/D) region, forming a channel region over the S/D region, and forming a sacrificial etch-back control stack on an upper surface of the channel region. The method further comprises, forming a gate on sidewalls of the channel region and etch-back control stack. The gate defines a first gate length of the vertical-type semiconductor device. The method further comprises removing the sacrificial etch-back control stack to form a trench extending between inner sidewalls of the gate. The method further comprises performing a selective etching process that etches the gate while preserving the channel region to define a second gate length that is less than the first gate length, and forming a second S/D region on an upper surface of the channel region to form the vertical-type semiconductor device.

According to another non-limiting embodiment, a method of fabricating a vertical-type semiconductor device comprises forming a semiconductor substrate including a first source/drain (S/D) region, and forming a channel region over the S/D region. The method further includes forming a sacrificial etch-back control stack on an upper surface of the channel region, and forming a hardmask cap over the sacrificial etch-back control stack. The method further includes depositing an electrically conductive gate layer that conforms to outer surfaces of the channel region, etch-back control stack, and hardmask cap. The method further comprises performing a first etching process comprising a first etching chemistry that recesses the electrically conductive gate layer at a first etching rate to form an initial gate defining a first gate length. The method further includes removing the sacrificial etch-back control stack and hardmask cap to form a trench extending between inner sidewalls of the gate, and performing a second etching process comprising the first etching chemistry. The second etching process is applied to the initial gate via the trench such that a localized etching area defined by the trench reduces an etching rate of the second etching process and the initial gate is recessed to define a second gate length that is less than the first gate length. The method further includes forming a second S/D region on an upper surface of the channel region to form the vertical-type semiconductor device.

According to still another non-limiting embodiment, a vertical-type semiconductor device includes a semiconductor substrate that extends along a horizontal axis to define a length of the semiconductor substrate, and extends along a vertical axis perpendicular to the horizontal axis to define a height of the semiconductor substrate. A first source/drain (S/D) region is on an upper surface of the semiconductor substrate. A channel region is on an upper surface of the first S/D region, and extends along the vertical axis to define a channel length. A second S/D region is on an upper surface of the channel region, and separates the second S/D region from directly contacting the semiconductor substrate. An electrically conductive gate wraps around all outer surfaces of the channel region. The gate extends along the vertical axis to define a gate length that is less than the channel length. Dielectric gate elements are interposed between an upper surface of the gate and a lower surface of the second S/D region, and are configured to electrically insulate the gate from the second S/D region.

Other non-limiting embodiments are described in detail herein and are considered a part of the claimed invention. For a better understanding of the invention, refer to the description and to the drawings.

DETAILED DESCRIPTION

Figure 1A:
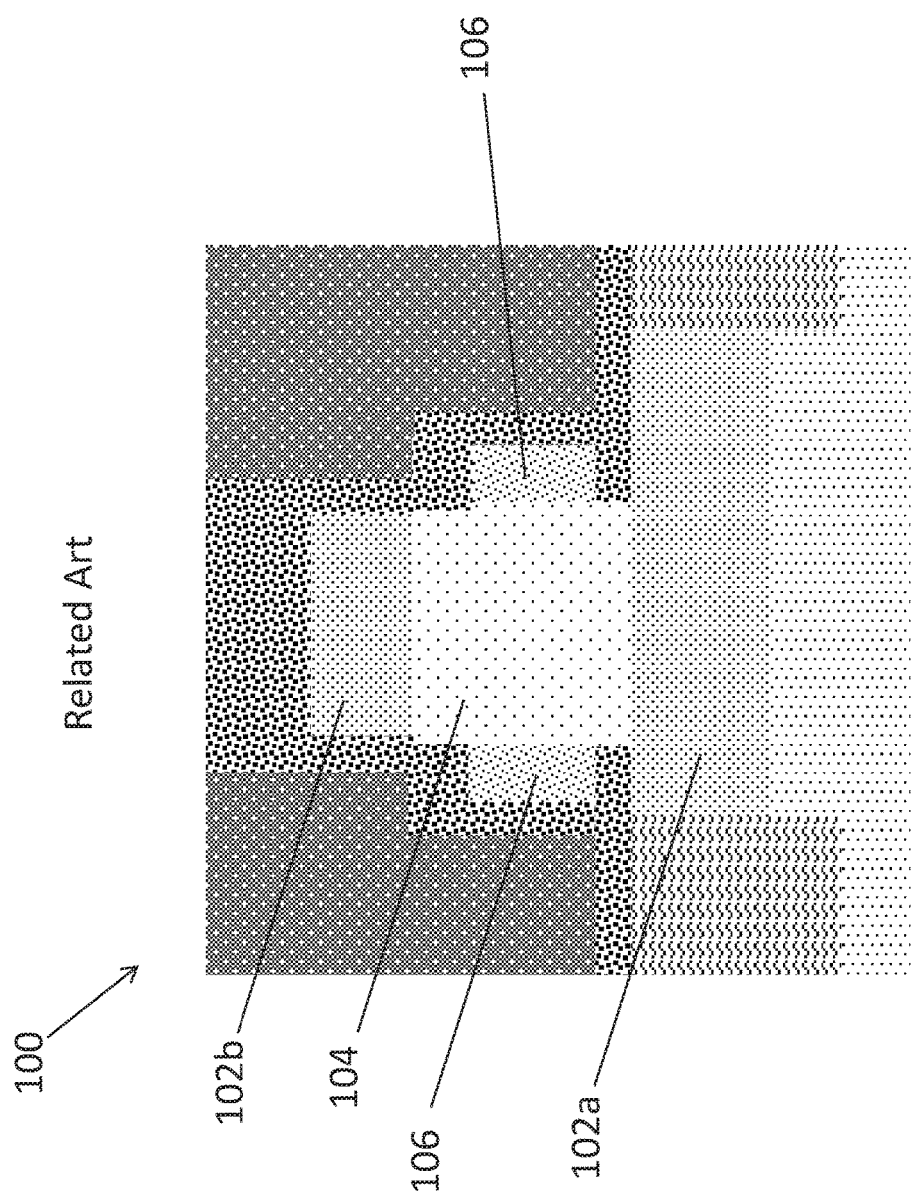
FIG. 1A is a cross-sectional view of a vertical FET following a conventional metal gate etch-back process that over-etches the metal gate material.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to the present inventive teachings, vertical finFETs are formed with a channel region vertically arranged between a lower S/D region and an upper S/D region. Accordingly, current flows in a vertical direction between the lower S/D region and the upper S/D region, and thus flows primarily normal to the top surface of the device. Referring to FIG. 1A, for example, a vertical FET 100 is fabricated such that source/drain (S/D) regions 102a-102b are arranged at opposing ends of a vertical channel region 104, and a gate 106 wraps entirely around the walls of the channel region 104. The vertical orientation of the vertical FET 100 allows for controlling the voltage rating as a function of the doping and thickness of the epitaxial layer, while the current rating is controlled as a function of the channel width. Accordingly, a vertical FET 100 can sustain both high blocking voltage and high current within a compact semiconductor substrate (e.g., silicon substrate). Vertical FETs can also allow for relaxed gate lengths to better control device electrostatics, without sacrificing the gate contact pitch size. Further, the vertical orientation of the channel region allows the gate to encapsulate or wrap around all walls of the channel region thereby improving electrostatic gate control while offering the potential to reduce gate voltages.

Figure 1C:
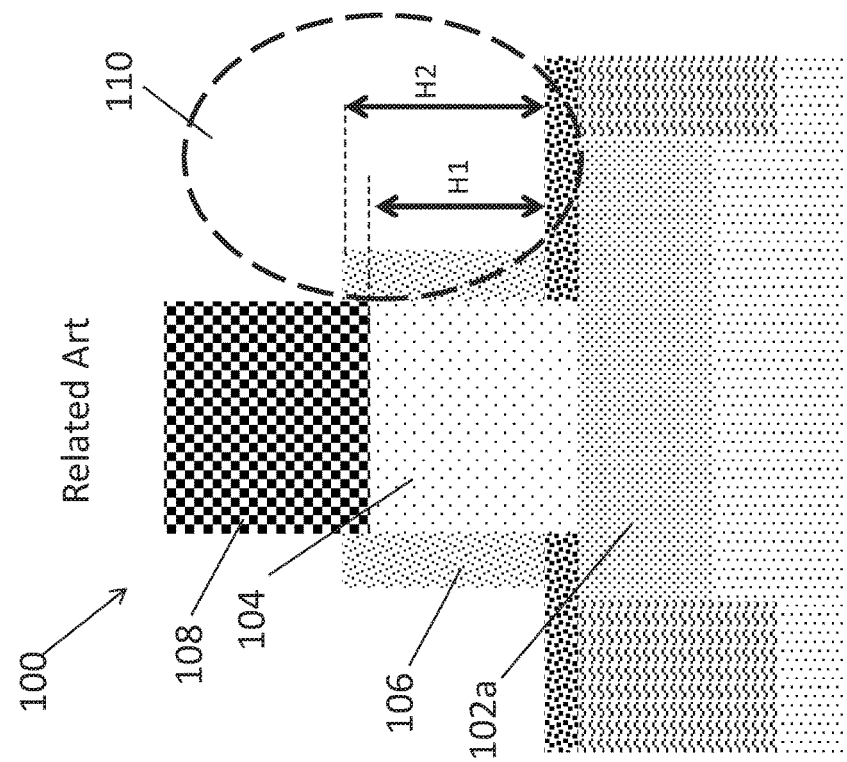
FIG. 1C is a cross-sectional view of a vertical FET following a conventional metal gate etch-back process that under-etches the metal gate material.
Figure 1B:
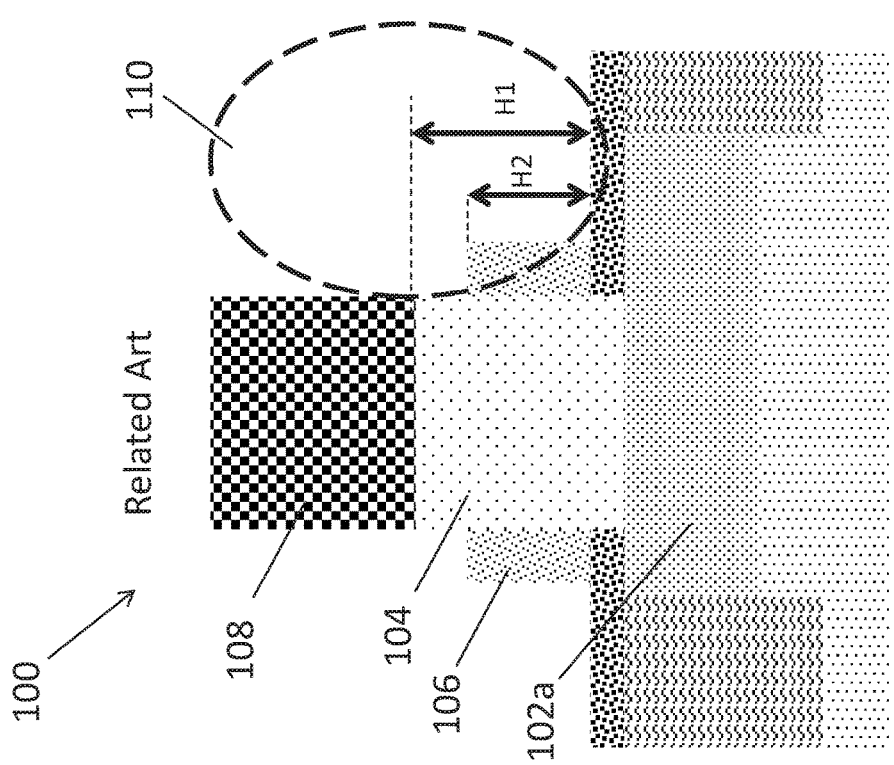
FIG. 1B is a cross-sectional view of a vertical FET following a conventional metal gate etch-back process that over-etches the metal gate material.

FIGS. 1B and 1C illustrate conventional vertical FET fabrication processes that include a metal gate etch-back process to recess the gate metal layer 106 which defines the gate length (H2) of the device. The etch-back process typically utilizes a channel hardmask 108 formed on an upper surface of the channel region 104. The metal gate material 106 is deposited to cover a hardmask layer 108 and the channel region 104, and the etch-back process is performed to form the metal gate 106 around the walls of the channel region 104.

When performing the etch-back process, however, the amount of metal gate material 106 that is etched is difficult to control due to large open areas 110 surrounding gate material 106. For instance, the large open area 110 surrounding the metal gate material 106 promotes aggressive etching of the metal material 106 making it difficult to control the amount of metal material 106 to etch away from device. Consequently, the conventional etch-back process can result in over-etching or under-etching of the metal gate. Over-etching the metal gate (see FIG. 1B) can result in recessing the metal gate material 106 beyond a desired stop point and beneath the channel hardmask (i.e., the gate length H2 is less than the channel length H1), thereby causing gate control loss. Under-etching the metal gate material 106 (see FIG. 1C) leaves an excess amount of metal gate material 106 above the channel region 104 (i.e., the gate length H2 is greater than the channel length H1), which causes undesirable parasitic capacitance penalties.

Turning now to an overview of the present invention, one or more non-limiting embodiments provide a vertical FET with an etch-back control stack interposed between the channel region and the channel hardmask. The etch-back control stack serves as a buffer region allowing the gate stack be etched to an intermediate depth before reaching the channel region. The preliminary etched gate stack is then surrounding by gate spacer layers and an interlayer dielectric (ILD) before a second etch-back procedures that forms the final dimensions of the gate stack. Because preliminary etched gate stack is surrounded by the gate spacer layers and ILD, the material of the gate stack is etched more slowly. Accordingly, the recessed depth of the gate stack can be controlled so as to mitigate or even eliminate instances of over-etching and/or under-etching.

Figure 2:
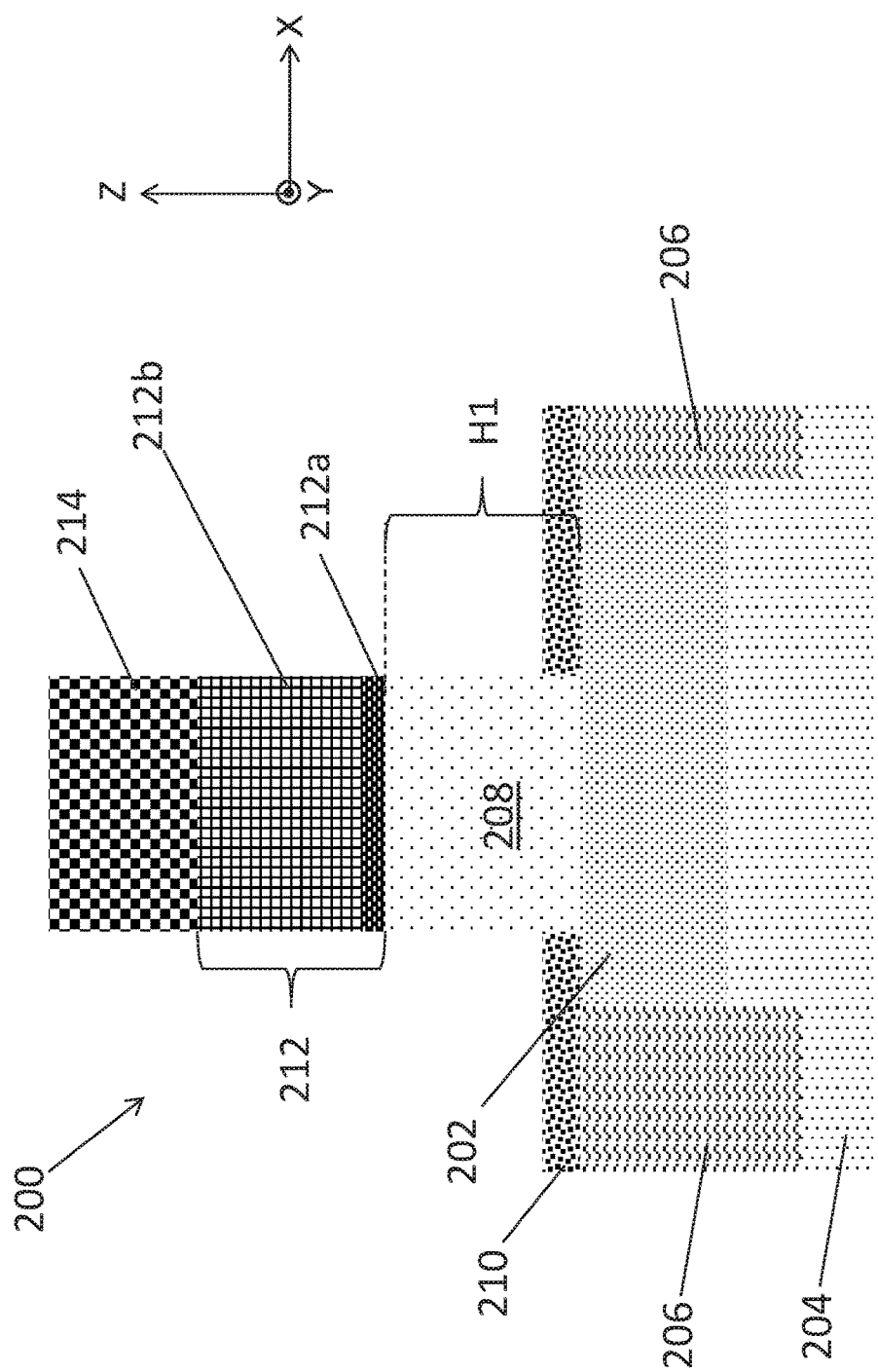
FIG. 2 is a cross-sectional view of an intermediate vertical FET including an etch-back control stack interposed between a channel region of the vertical FET and a channel hardmask.

With reference now to FIG. 2, an intermediate vertical-type semiconductor device 200 such as a vertical field effect transistor (vertical FET), for example, is illustrated. The intermediate vertical semiconductor device 200 includes a first S/D region 202 (e.g., a lower S/D region 202) formed on an upper surface of a semiconductor substrate 204. The semiconductor substrate extends along a first axis (e.g., X-axis) to define a length, a second axis (e.g., Y-axis) to define a width, and a third axis (e.g., Z-axis) to define a height.

The lower S/D region 202 can be composed, for example, of silicon (Si), silicon germanium, germanium (SiGe), silicon carbide (SiC), indium phosphide (InP), gallium arsenide (GaAs), the like, or a combination thereof. Various epitaxy processes can be performed to form the lower S/D region 202 including, but not limited to, metal-organic CVD (MOCVD) epitaxy, molecular beam epitaxy (MBE), liquid phase epitaxy (LPE), vapor phase epitaxy (VPE), selective epitaxial growth (SEG), the like, or a combination thereof. The lower S/D region 202 can further be doped via in situ doping during growth and/or subsequent implantation. The dopants include, for example, boron, indium, or the like for a p-type transistor, and include, for example, phosphorus, arsenic, or the like for an n-type transistor.

The semiconductor substrate 204 can further include shallow trench isolation (STI) regions 206 that surround the lower S/D region 202. The STI regions 206 are formed from various dielectric materials including, for example, silicon dioxide ($SiO_2$) and are configured to prevent or reduce electric current leakage between adjacent semiconductor device components.

The intermediate vertical semiconductor device 200 further includes a channel region 208, and one or more S/D spacers 210 (e.g. lower S/D spacers 210) formed on an upper surface of the lower S/D region 202. The channel region 208 is composed of a semiconductor material including, but not limited to, Si, SiGe, etc. The height (H1) of the channel region 208 (e.g., extending along the Z-axis) effectively defines the channel length and can range, for example, from approximately 10 nanometers (nm) to approximately 40 nm. The length of the channel region 208, however, is not limited thereto.

The S/D spacers 210 are composed of a low dielectric (low-k) material such as, for example, silicon nitride (SiN). The S/D spacers 210 can also be doped with boron (B) or carbon (C), for example. The thickness (e.g., extending along the Z-axis) of the spacers 210 can range, for example, from approximately 5 nm to approximately 10 nm. Although the S/D spacers 210 are shown as overlapping the first S/D region 202, the invention is not limited thereto. For example, the length of the channel region (e.g., extending along the X-axis) can be increased such that the S/D spacers 210 are formed approximately flush with the interface between the STI region 206 and the first S/D region 202.

Still referring to FIG. 2, the intermediate vertical semiconductor device 200 includes a sacrificial etch-back control stack 212 that is formed over the channel region 208. The etch-back control stack 212 includes a sacrificial oxide layer 212a and a sacrificial gate layer 212b. The sacrificial oxide layer 212a is composed of $SiO_2$, for example, and is formed on the upper surface of the channel region 208. The thickness (e.g., extending along the Z-axis) of the sacrificial oxide layer 212a ranges, for example, from approximately 5 nm to approximately 10 nm, and can be formed using various deposition techniques including, but not limited to, chemical vapor deposition (CVD), plasma enhanced CVD (PECVD), and atomic layer deposition (ALD).

The sacrificial gate layer 212b is formed on the upper surface of the sacrificial oxide layer 212a. Accordingly, the sacrificial oxide layer 212a is interposed between the channel region 208 and the sacrificial gate layer 212b. The sacrificial gate layer 212b is formed from amorphous silicon (a-Si), for example, and has a height (e.g., extending along the Z-axis) ranging from approximately 20 nm to approximately 30 nm.

A hardmask cap 214 is formed on the upper surface of the sacrificial gate layer 212b to protect the etch-back control stack 212 from becoming damaged during subsequent fabrication processes. The hardmask cap 214 is composed of silicon nitride (SiN), for example, and can be formed on the sacrificial gate layer 212b using various deposition techniques including, but not limited to, CVD, PECVD, and ALD. Accordingly, the etch-back control stack 212 is interposed between the channel region 208 and the hardmask cap 214.

Figure 3:
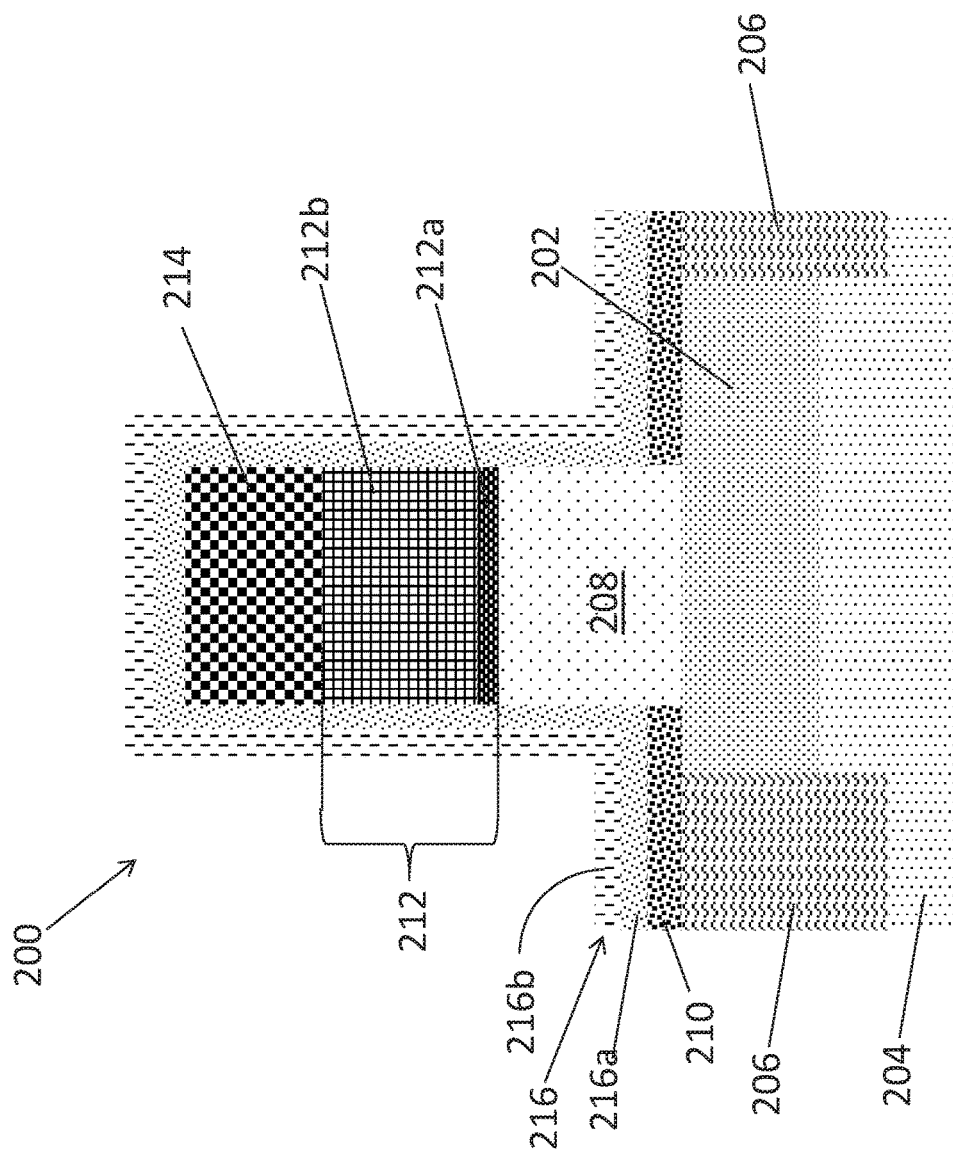
FIG. 3 illustrates the vertical FET shown in FIG. 2 following deposition of a gate layer.

Turning to FIG. 3, the intermediate vertical semiconductor device 200 is illustrated following deposition of a gate layer 216 that conforms to the exposed surfaces of the S/D spacers 210, channel region 208, etch-back control stack 212, and channel hardmask 214. The gate layer 216 can include one or more individual layers of high dielectric constant (high-k) material and/or metal gate material. For example, the gate layer 216 can include a high-k gate layer 216a and a metal gate layer 216b formed on the high-k gate layer 216a. The high-k gate layer 216a is composed of a high-k material including, but not limited to, hafnium-based materials such as hafnium oxide ($HfO_2$), for example. The metal gate layer 216b is composed of various metal gate materials including, but not limited to, titanium nitride (TiN) and tantalum nitride (TaN). The high-k material and/or the metal gate material can be deposited using various deposition techniques including, but not limited to, CVD, PECVD, and ALD. The thickness of the high-k gate layer 216a can range, for example, from approximately 3 nm to approximately 5 nm. The metal gate layer 216b can range, for example, from approximately 5 nm to approximately 7 nm.

Figure 4:
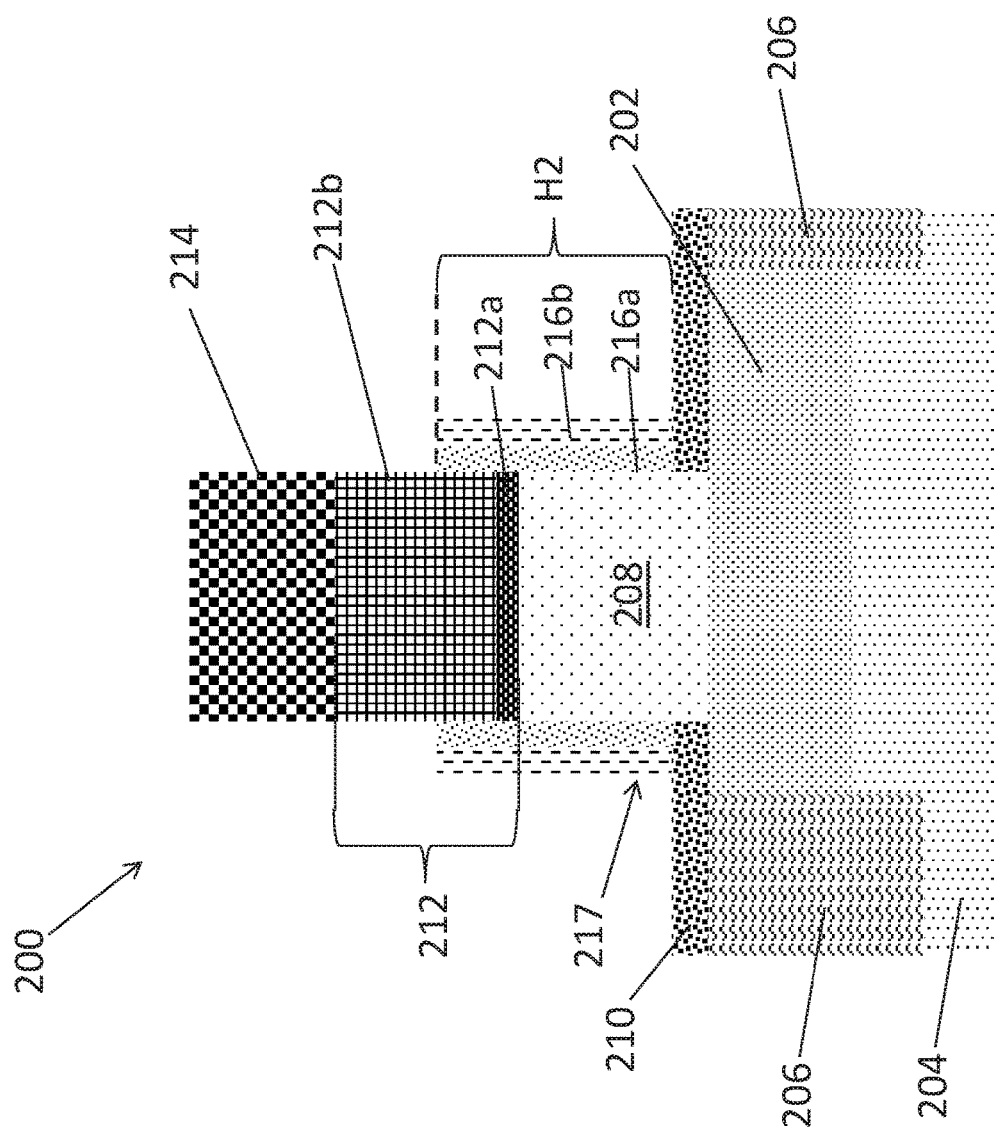
FIG. 4 illustrates the vertical FET shown in FIG. 3 after performing an etching process that recesses a portion of the gate layer to form a gate stack.

Referring to FIG. 4, a directional etching process is performed to remove a portion of the gate layer 216. The direction etching process includes, for example, an oxide-based dry reactive ion etch (RIE) process, which selectively etches the gate layer 216 while maintaining the S/D spacers 210, sacrificial gate layer 212b, and hardmask 214. The etching process can be performed such that a portion of the sacrificial gate layer 212b is exposed. In this manner, the gate layer 216 is recessed to form an electrically conductive gate stack 217 that defines an initial gate length (H2).

Figure 5:
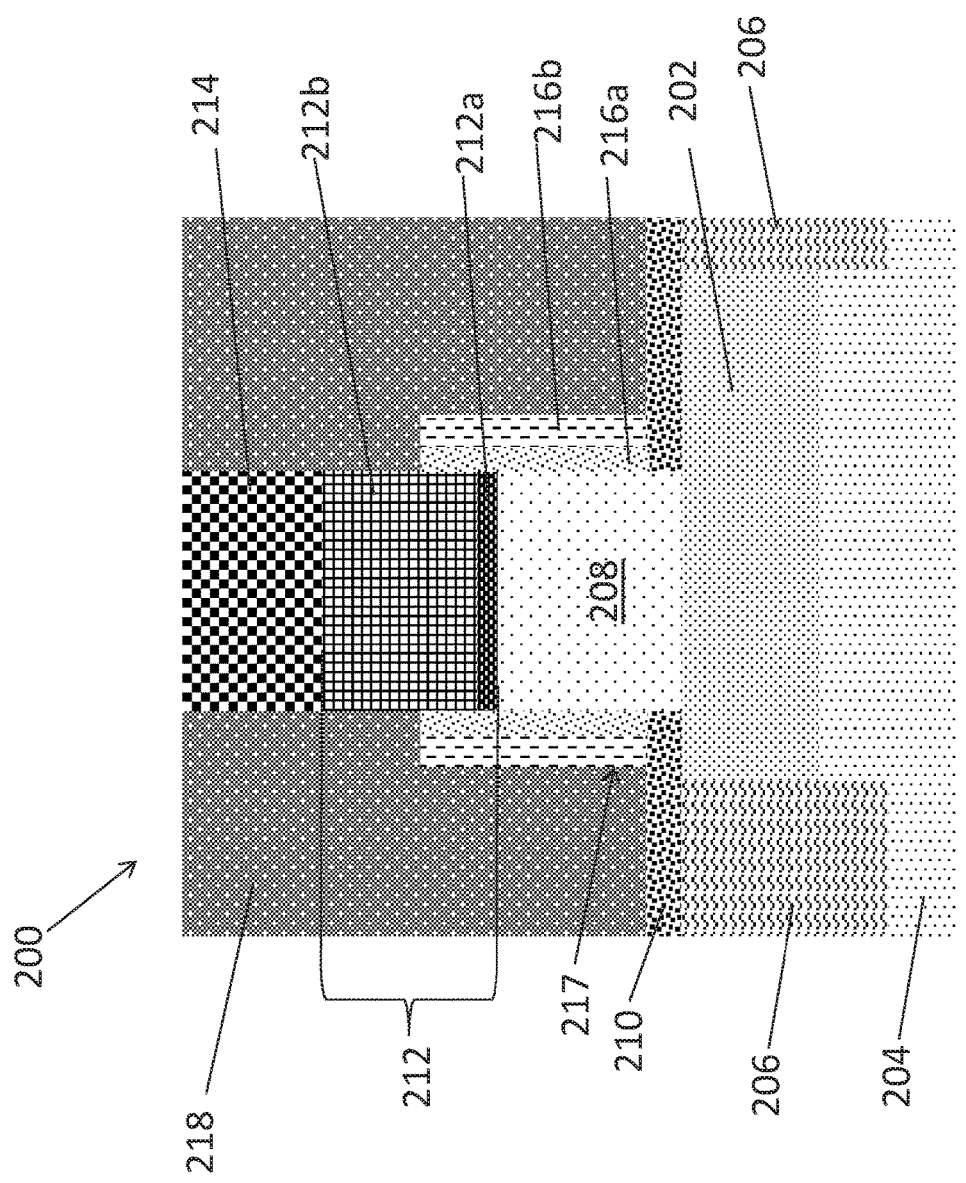
FIG. 5 illustrates the vertical FET shown in FIG. 4 following deposition of an electrically conductive gate contact material.

Turning to FIG. 5, the vertical semiconductor device 200 is illustrated following deposition of an electrically conductive gate contact material 218 that surrounds the gate stack 217, the etch-back control stack 212, and the channel region 208. The gate contact material 218 can be composed of tungsten (W), for example, and can be deposited according to a CVD or PECVD process.

Figure 6:
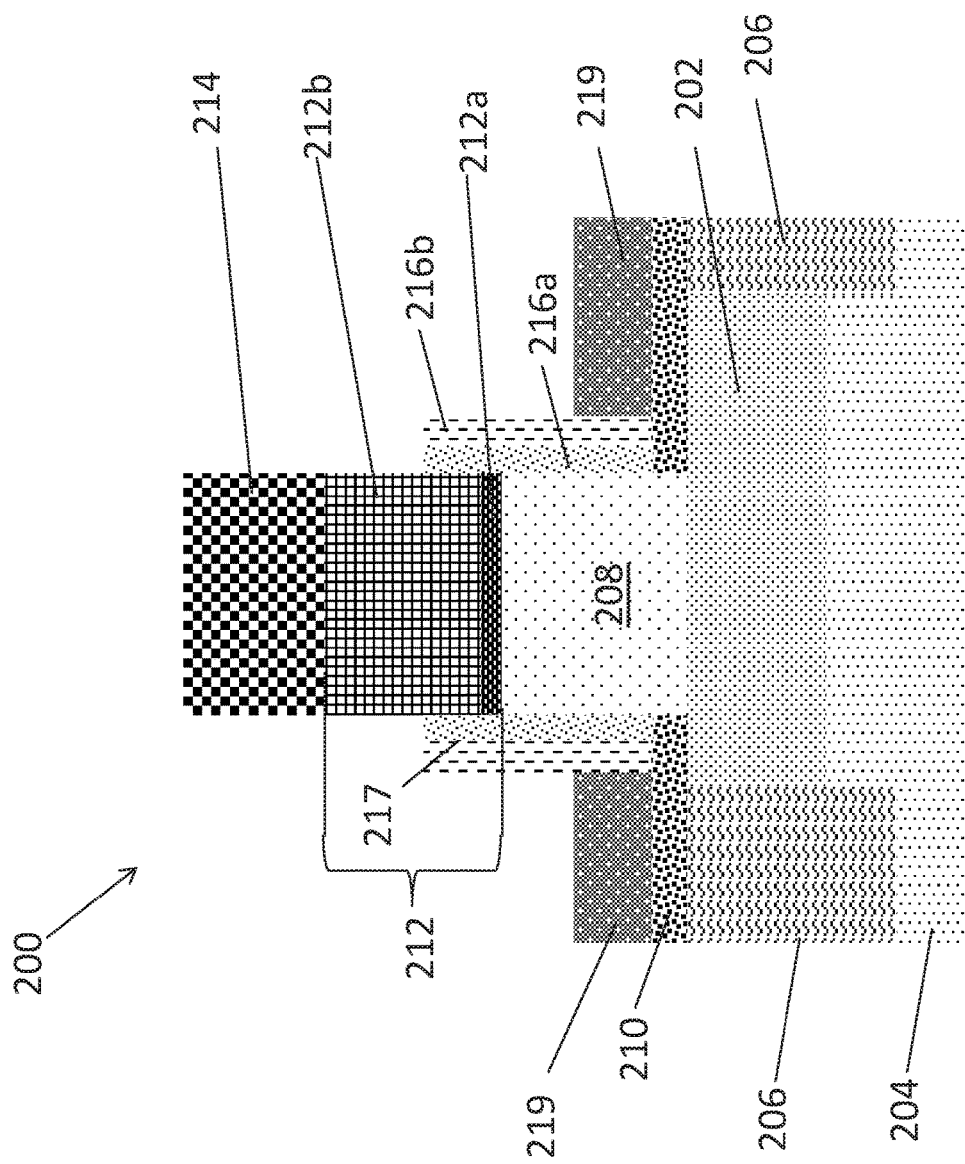
FIG. 6 illustrates the vertical FET shown in FIG. 5 after recessing the gate contact material to form a gate contact.

With reference to FIG. 6, the vertical semiconductor device 200 is illustrated after performing a selective directional etching process that etches the gate contact material (previously indicated at numeral 218) to form a gate contact 219. Various etching processes can be used to form the gate contact 219 including, but not limited to, a dry plasma etch composed of gases ambient of silicon hexafluoride, (SiF6) to form the fluoride (F) radical with tungsten hexafluoride (WF6) vapor to evaporate. The gate contacts can have a thickness ranging, for example, from approximately 5 nm to approximately 10 nm.

Figure 7:
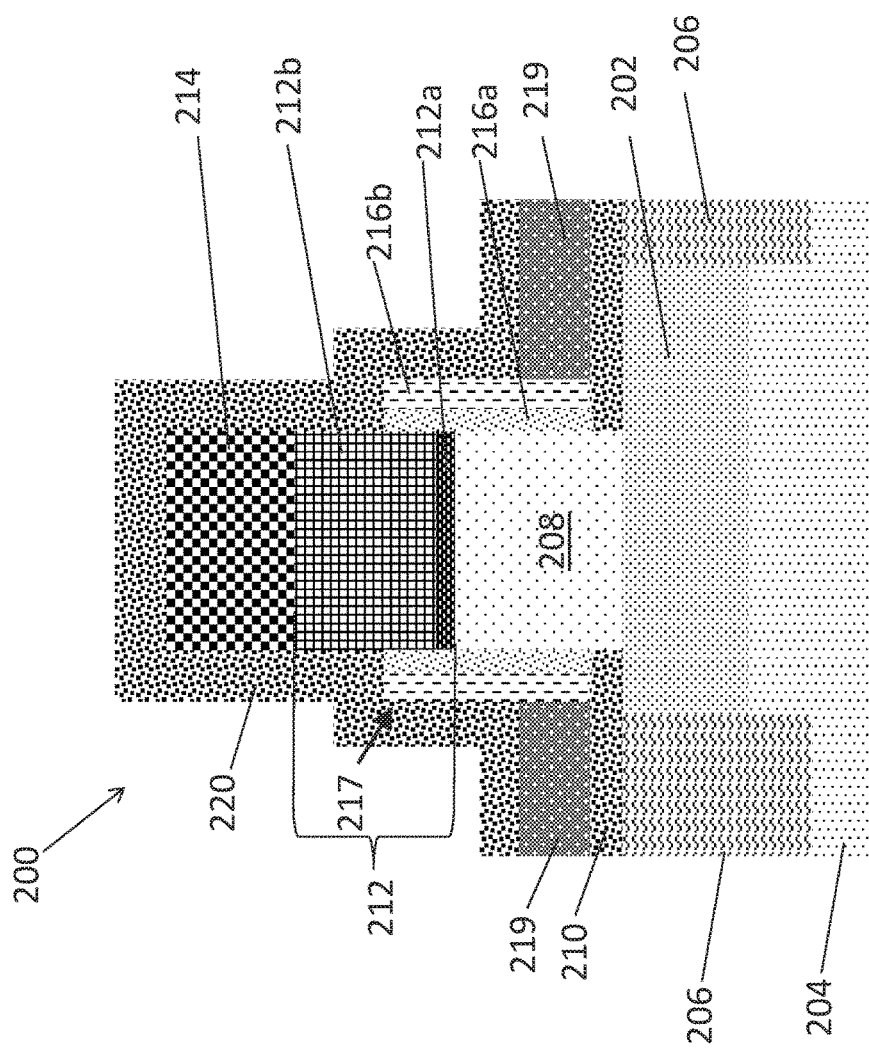
FIG. 7 illustrates the vertical FET shown in FIG. 6 following deposition of a gate spacer layer.

Referring to FIG. 7, the vertical semiconductor device 200 is illustrated following deposition of a gate spacer layer 220 that covers the gate contact 219 along with the gate stack 217, etch-back control stack 212, and channel hardmask 214. The gate spacer layer 220 is composed of a low dielectric (low-k) material such as, for example, silicon nitride (SiN). The gate spacer layer 220 can also be doped with boron (B) or carbon (C), for example. The thickness (e.g., extending along the Z-axis) of the gate spacer 220 can range, for example, from approximately 5 nm to approximately 10 nm.

Figure 8:
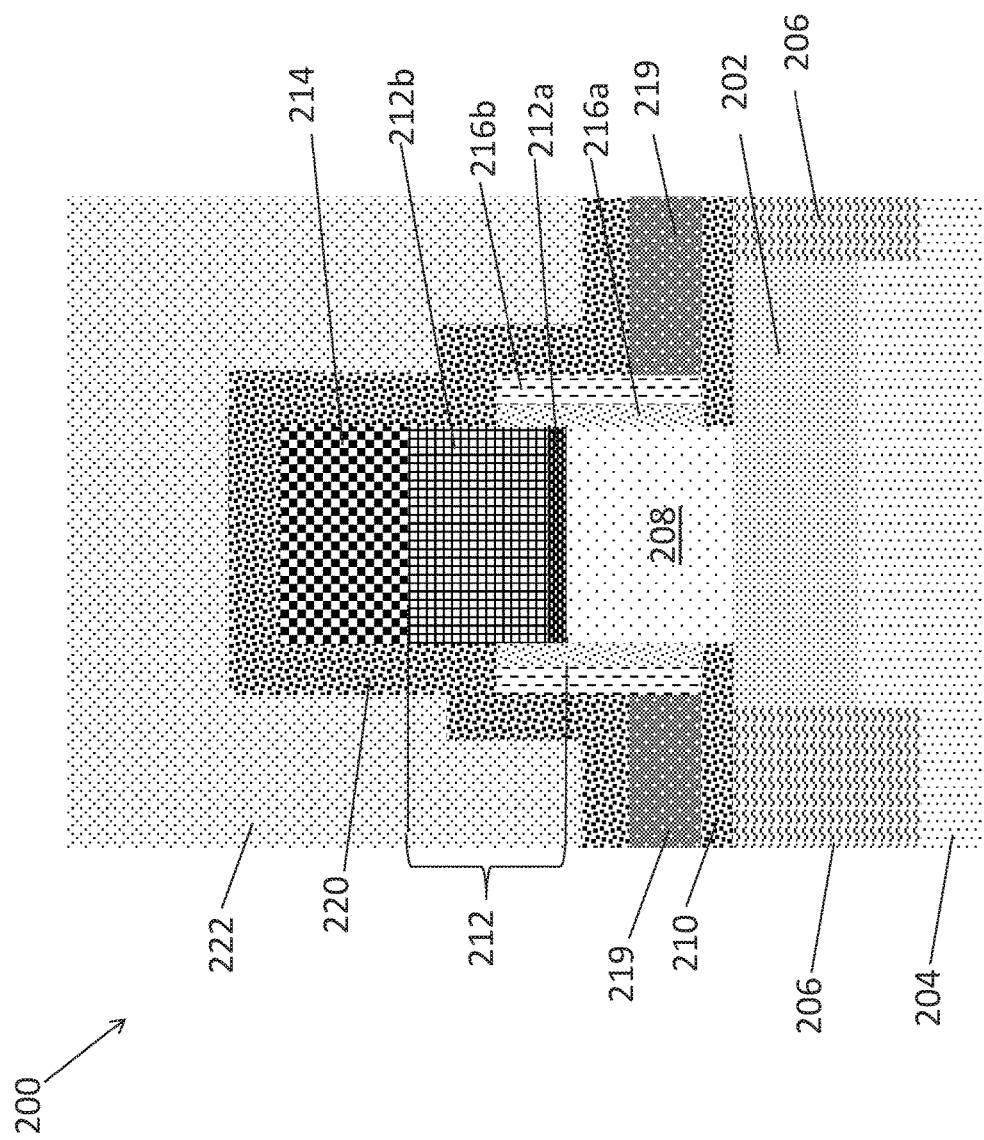
FIG. 8 illustrates the vertical FET shown in FIG. 7 following deposition of an organic planer layer (OPL) over the gate spacer layer.

Turning to FIG. 8, the vertical semiconductor device 200 is illustrated following deposition an organic planarization layer (OPL) 222 over the gate spacer layer 220. The OPL 222 can be deposited using a spin-coating process and is composed of a flowable organic polymer including C, H, and N. The OPL 222 is capable of generating etch residues during a reactive ion etch process that is re-deposited on un-etched portions of the OPL 222.

Figure 9:
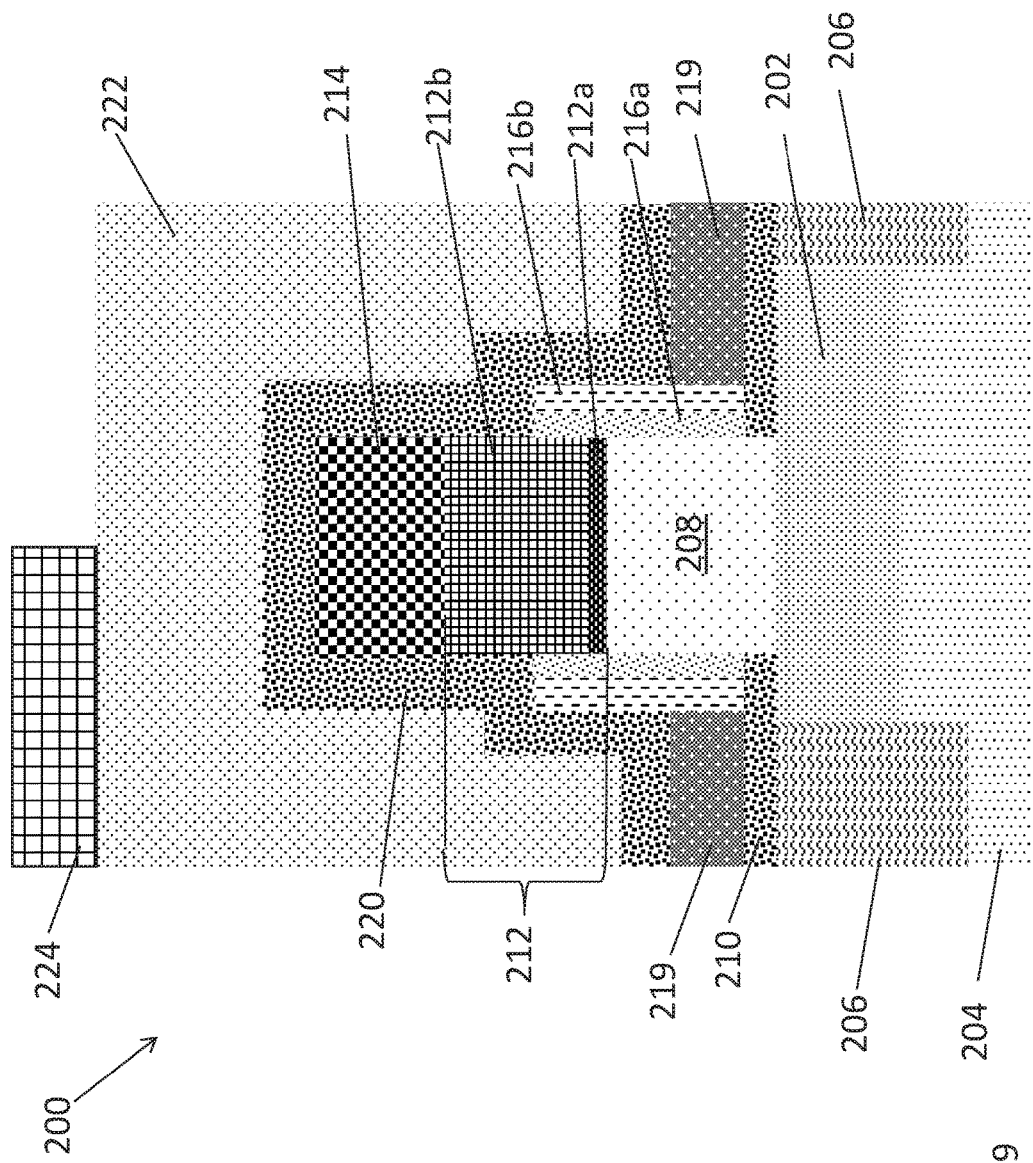
FIG. 9 illustrates the vertical FET shown in FIG. 8 after patterning a masking layer deposited on an upper surface of the OPL.

Referring to FIG. 9, a hard mask 224 composed of $SiO_2$ or SiN, for example, is formed on the upper surface of the OPL 222. The hard mask 224 is subsequently patterned such that an underlying portion of the OPL 222 is exposed. The hard mask 224 can have a thickness (e.g., extending along the Z-axis) ranging from about 5 nm to about 100 nm.

Figure 10:
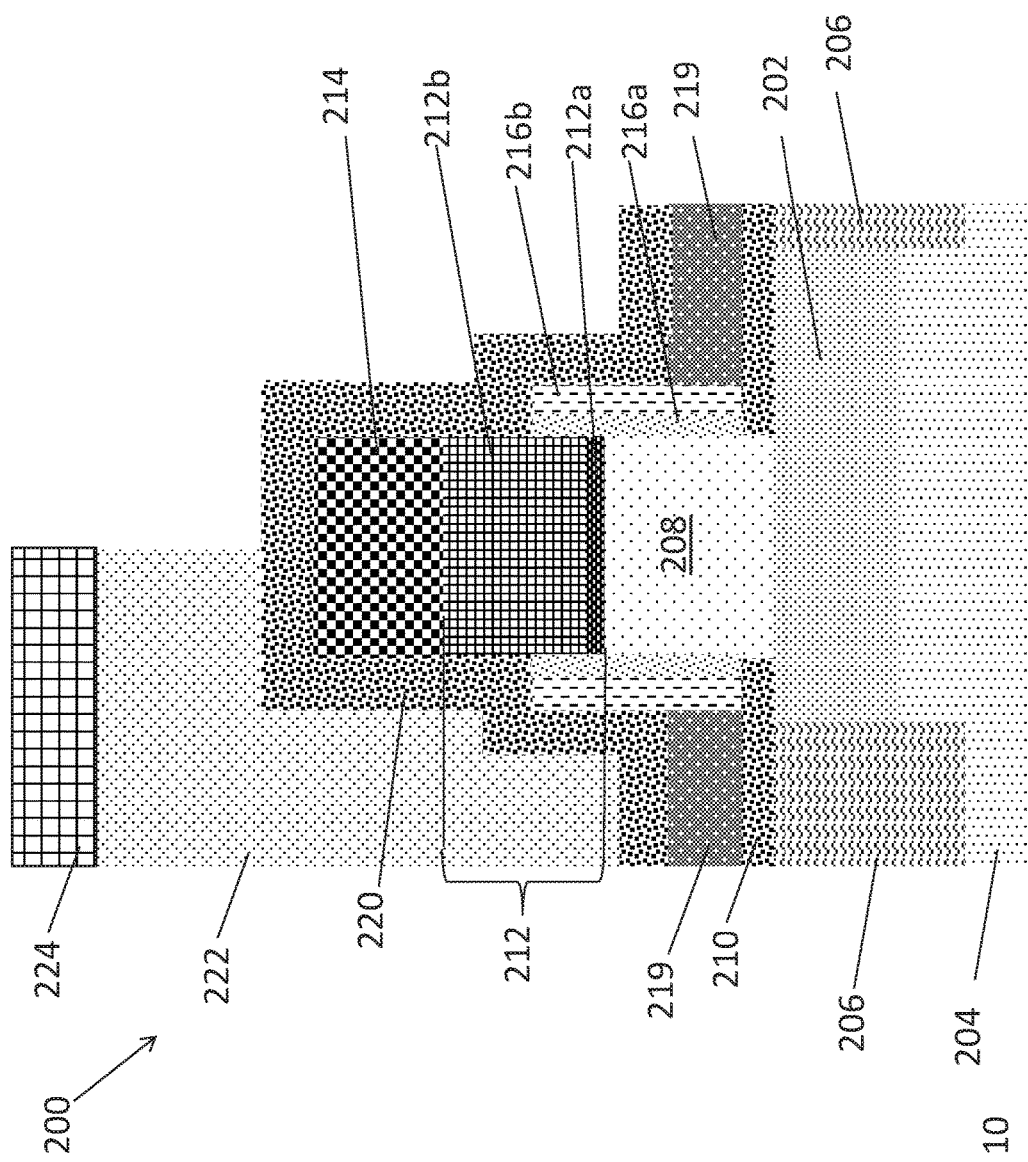
FIG. 10 illustrates the vertical FET shown in FIG. 9 after removing an uncovered portion of the OPL to expose a portion of the gate spacer layer.

Turning to FIG. 10, the vertical semiconductor device 200 is illustrated after removing the exposed portion of the OPL 222. The exposed OPL 222 can be selectively stripped away from the vertical semiconductor device 200 without substantially attacking the gate spacer layer 220 using, for example, oxygen plasma, nitrogen plasma, hydrogen plasma or other carbon strip process. Accordingly, the underlying gate spacer 220 layer is exposed.

Figure 11:
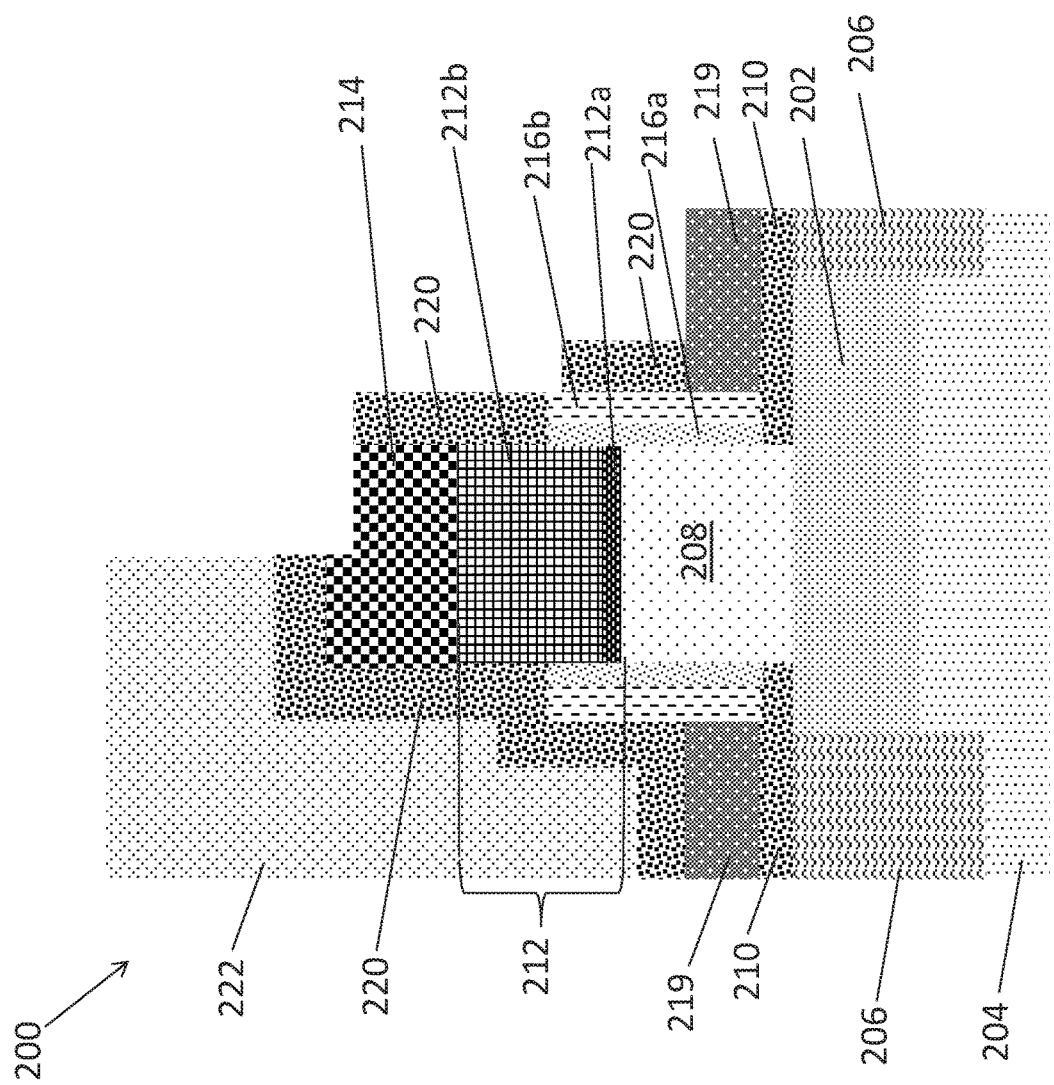
FIG. 11 illustrates the vertical FET shown in FIG. 10 following a directional etching process that partially removes the gate spacer layer from upper surfaces of the channel mask and the gate contact.

Referring to FIG. 11, a directional etching process is performed to remove portions of the gate spacer layer 220. The direction etching process includes a directional dry RIE process that is selective to nitride based-materials. Accordingly, portions of the gate spacer layer 220 disposed over the hardmask cap 214 and gate contact 219 are exposed. In addition, a portion of the hardmask cap 214 can be recessed; however, the hardmask cap 214 is formed with sufficient thickness that allows for some recess without exposing the underlying etch-back control stack 212.

Figure 12:
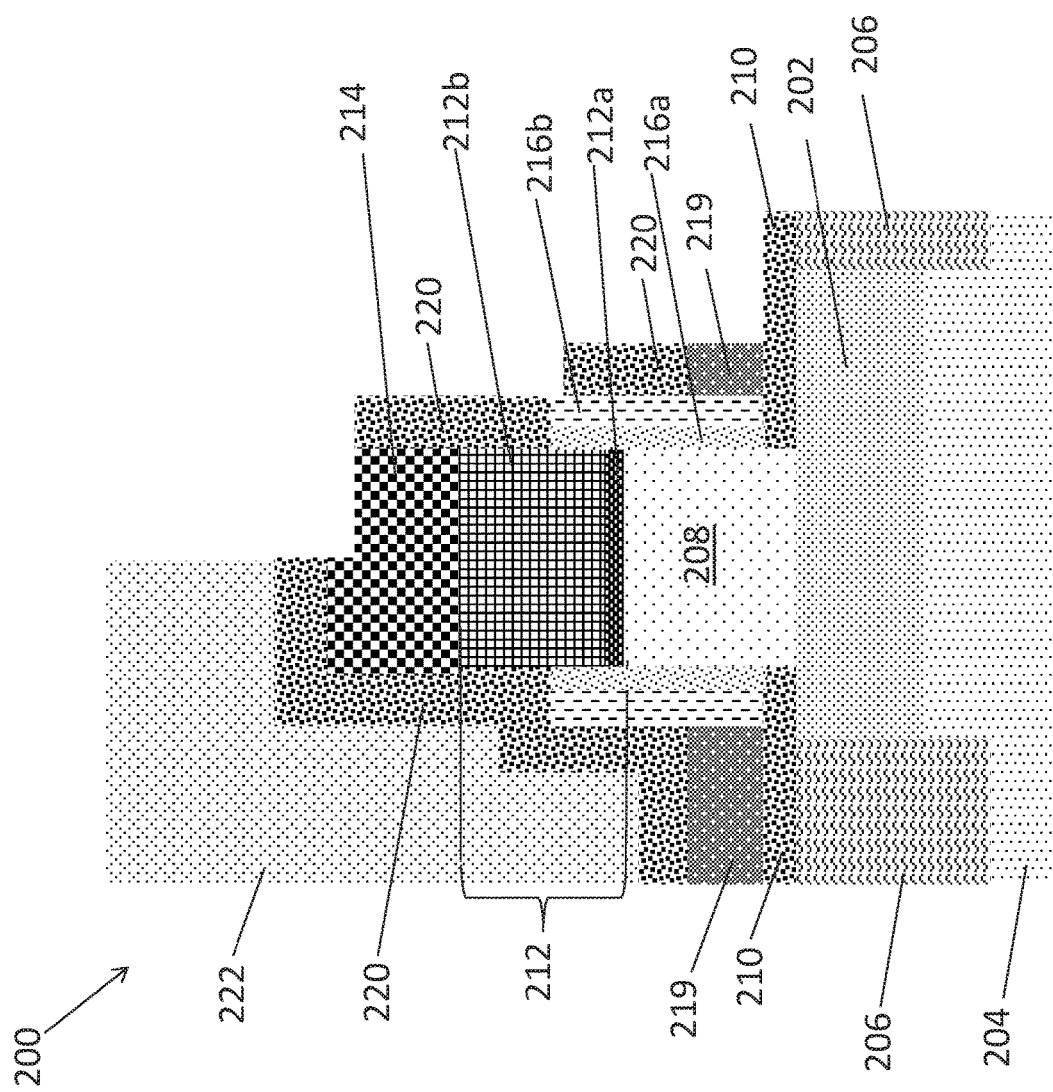
FIG. 12 illustrates the vertical FET shown in FIG. 11 following a second directional etching process that partially removes a portion of the gate contact from the upper surface of a lower source/drain (S/D) spacer.

Referring to FIG. 12, the vertical semiconductor device 200 is illustrated following a second selective etching process that removes the exposed portion of the gate contact 219 from the upper surface of the lower S/D spacer 210. Accordingly, the lower S/D region 202 can be accessed following formation of an electrically conductive via (not shown in FIG. 12) which is described in greater detail below. Various etching processes can be used to remove the gate contact 219 including, but not limited to, a dry plasma etch composed of gases ambient of silicon hexafluoride, (SiF6) to form the fluoride (F) radical with tungsten hexafluoride (WF6) vapor to evaporate. The chemistry is selective to various dielectric materials such that the underlying S/D spacer 210 is preserved.

Figure 13:
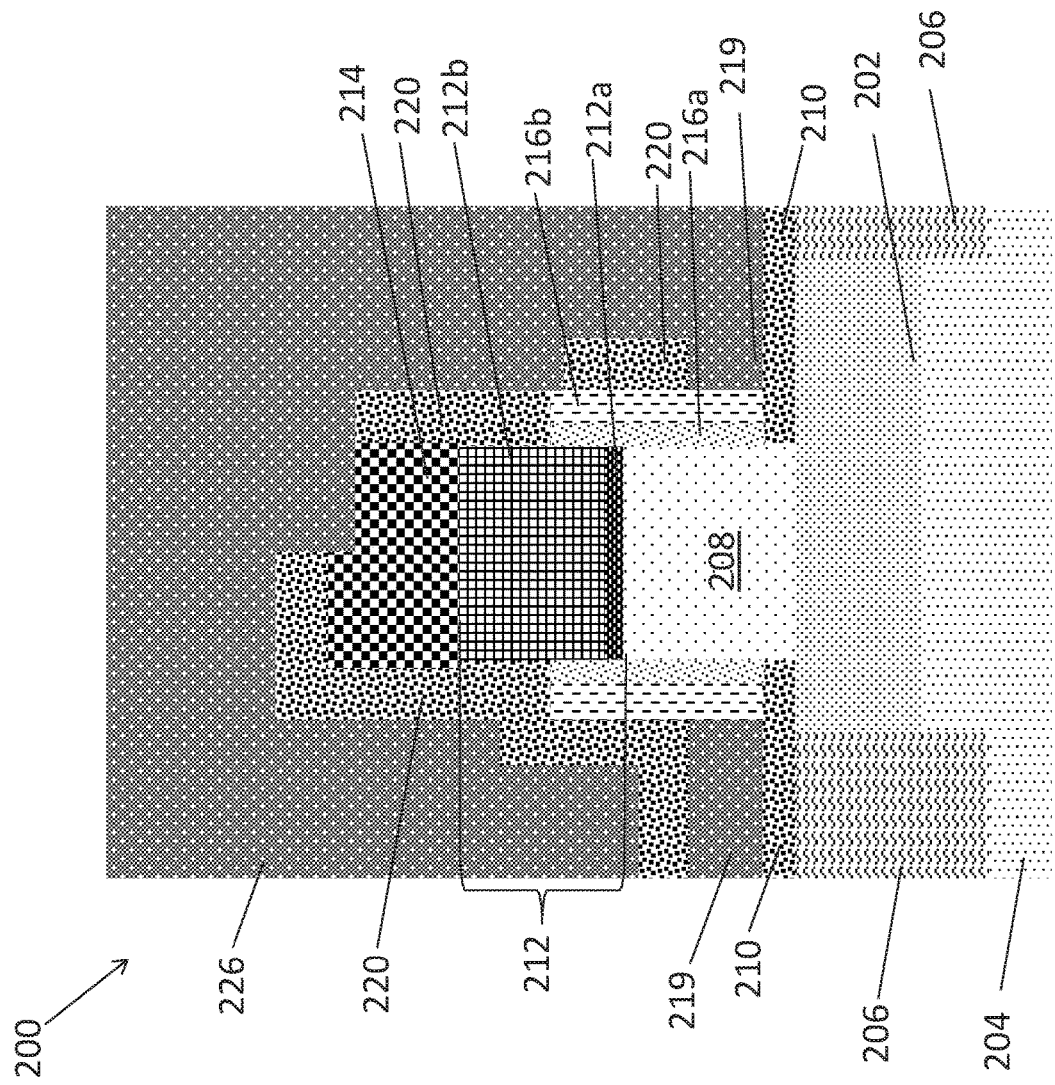
FIG. 13 illustrates the vertical FET shown in FIG. 12 after removing the remaining OPL and depositing an inter-layer dielectric (ILD)

With reference to FIG. 13, the vertical semiconductor device 200 is illustrated after stripping away the remaining portion of the OPL 222, and depositing an ILD 226 that surrounds the gate spacer layer 220, etch-back control stack 212, channel region 208, gate stack 217, and gate contact 219. The ILD 226 is composed of various dielectric materials including, but not limited to, silica, SiN and $SiO_2$, and can be deposited via CVD or PECVD.

Figure 14:
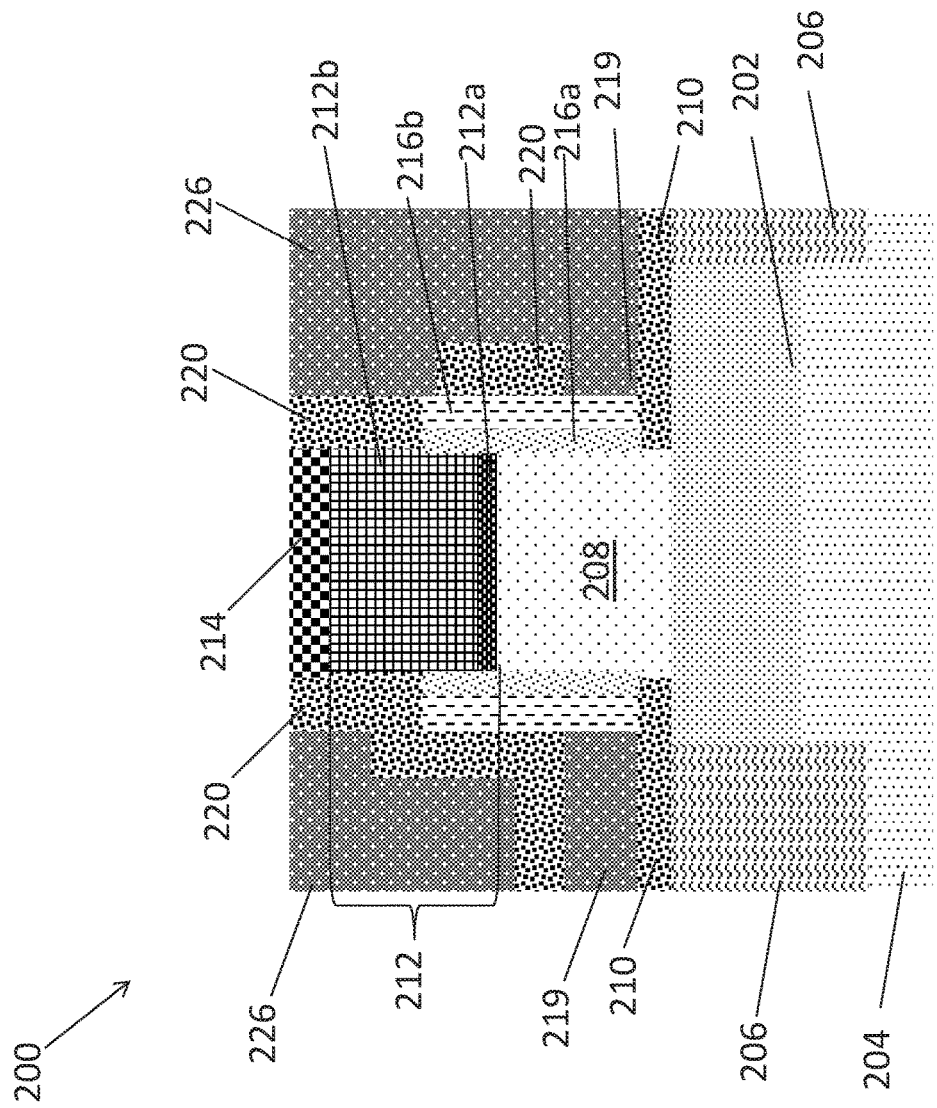
FIG. 14 illustrates the vertical FET shown in FIG. 13 following a chemical-mechanical planarization (CMP) process that forms an upper surface of the ILD flush with the gate spacer layer and the etch-back control stack.

The ILD 226 can be planarized to provide the semiconductor device 222 with a uniform upper surface. As shown in FIG. 14, for example, the ILD 226 is planarized via a CMP process, for example, such that the upper surfaces of the ILD 226, gate spacers 220, and hardmask cap 214 are flush with one another.

Figure 15:
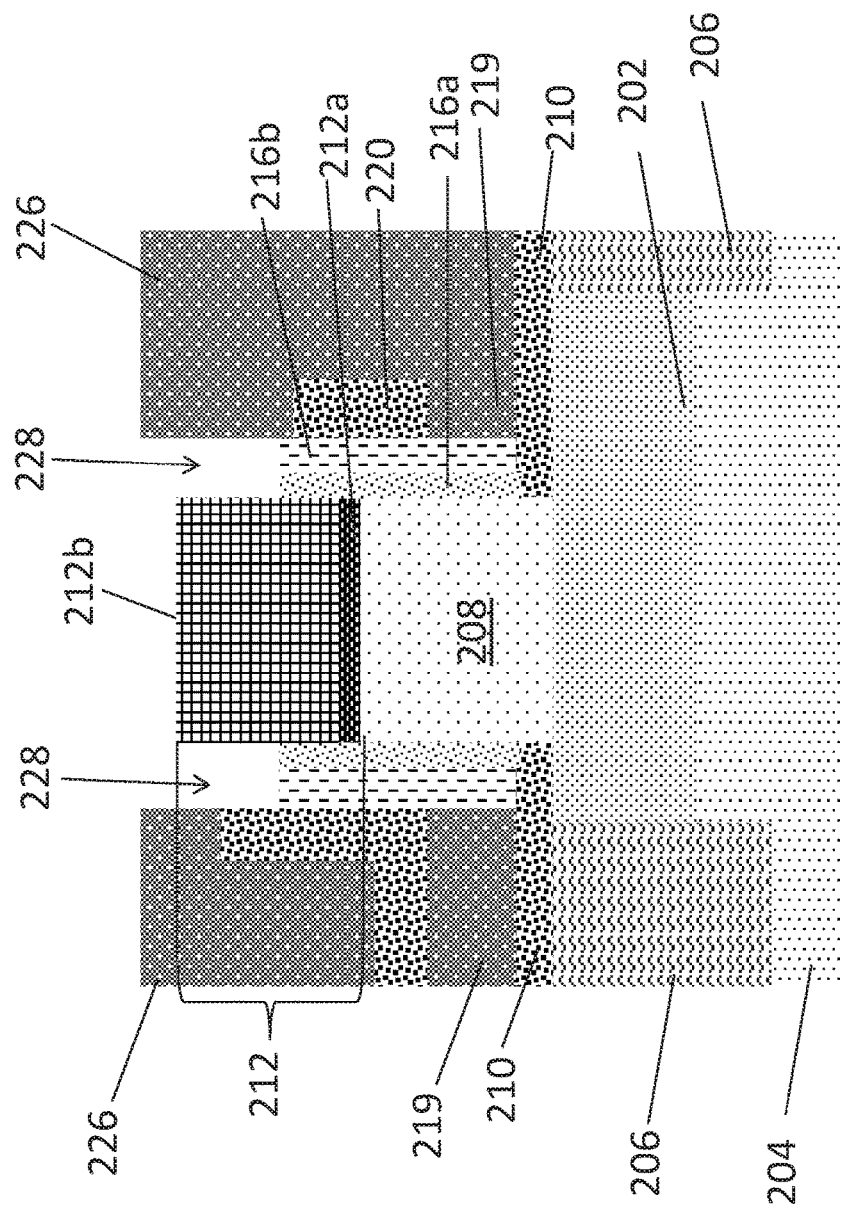
FIG. 15 illustrates the vertical FET shown in FIG. 14 after partially recessing the gate layer to form cavities between the ILD and the etch-back control stack.

With reference now to FIG. 15, the vertical semiconductor device 200 is illustrated after performing a directional etching process to provide access to the gate stack 217. The directional etching process includes a dry RIE process that is selective to nitride-based materials. Accordingly, a portion of the gate spacer 220 is removed from over the gate stack 217 and the hardmask cap (previously indicated as numeral 214) is removed from over the sacrificial gate layer 212b. The partial removal of the gate spacer layer 220 forms cavities 228 that expose the upper surface of the gate stack 217.

Figure 16:
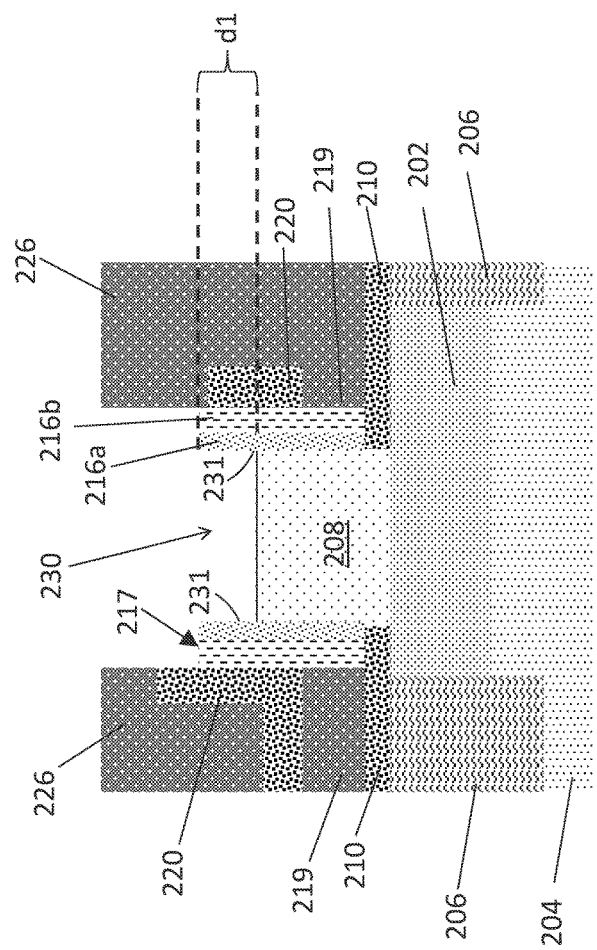
FIG. 16 illustrates the vertical FET shown in FIG. 15 following removal of the etch-back control stack to expose an upper surface of the channel region.

Referring to FIG. 16, the vertical semiconductor device 200 is illustrated following one or more etching processes that remove the etch-back control stack 212. For example, a first etching process including a chemistry of CF4, SF6 and BC12+Cl2, for example, is performed to etch the sacrificial gate layer 212b while stopping on an upper surface of the sacrificial oxide layer 212a. A second etching process is then performed including a chemistry of CF4, for example, to remove the sacrificial oxide layer 212a, while preserving the gate stack 217. Accordingly, the cavities (previously indicated as numeral 228) are expanded to define a trench 230 that extends between inner sidewalls 231 of the gate stack 217 and exposes the upper surface of the channel region 208. As further illustrated in FIG. 16, the gate stack 217 includes an extended portion which extends beyond the upper surface of the channel region 208 at a distance (d1).

Figure 17:
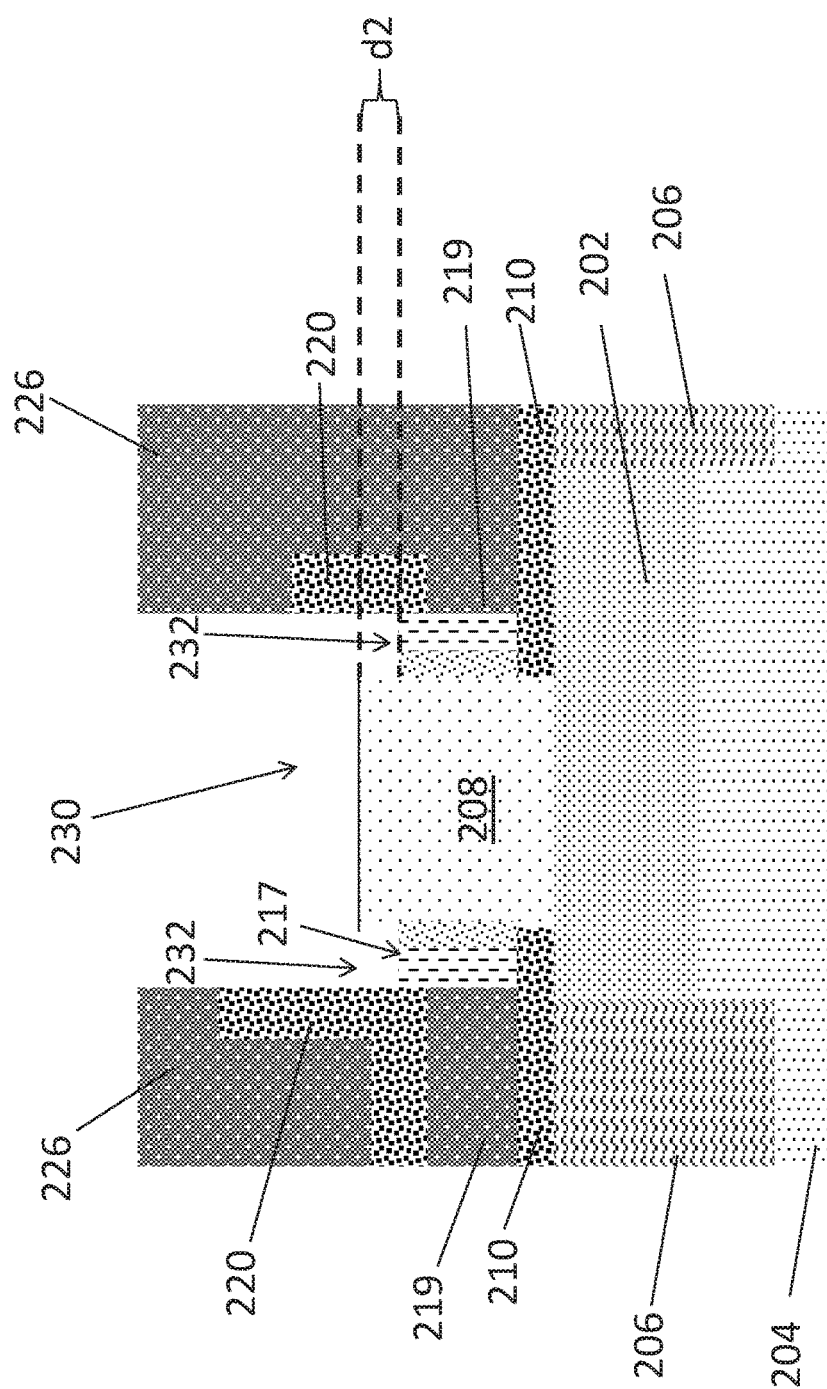
FIG. 17 illustrates the vertical FET shown in FIG. 16 after partially recessing the gate stack below the upper surface of the channel region.

Turning to FIG. 17, the vertical semiconductor device 200 is illustrated following a precision directional etching process to further recess the gate stack 217. In this example, the gate stack 217 is recessed below the upper surface of the channel region 208. Accordingly, divots 232 are formed between gate spacers 220 and the channel region 208. The direction etching process includes, for example, a dry plasma etching process including a chloride-based chemistry, which selectively etches the gate stack 217 while preserving the channel region 208. The dry RIE process can be performed according to a fixed time period to achieve a desired depth at which to recess the gate stack 217. The precision directional etching process can include a chloride-based plasma etch that is selective to Si. Accordingly, the underlying channel region 208 is preserved when removing the etch-back control stack 212. A post-etch anneal can also be performed at this stage to cure irregularities existing on the upper surface of the channel region 208.

The etching process at this stage is referred to as a "precision direction etching process" because unlike conventional vertical semiconductor device fabrication processes that permit large open areas to surround the recess the gate layer when performing the gate layer etch (see FIGS. 1A-1C), a non-limiting embodiment of the invention surrounds the gate stack 117 with the ILD 226 and gate spacers 220 while the trench 230 allows access to the gate stack 117. The trench 230 defines a localized etching area that reduces the etching rate of the etching process (e.g., the direction RIE). In this manner, the gate stack 217 can be recessed more precisely compared to conventional fabrication processes thereby reducing the possibility of over-etching or under-etching the gate stack 217 with respect to the channel region 208. For example, the localized etching area defined by the trench 230 reduces the etching rate of the dry RIE process such that the gate stack 217 can be precisely recessed below the upper surface channel region 208 (e.g., underlapped) by a desired distance (d2). It should be appreciated, however, that the precision etching technique described herein can recess the gate stack 217 such that the upper surface of the gate stack 217 is aligned (i.e. flush) or substantially aligned with the upper surface of the channel region 208. Although not shown, the reduced etching rate provided by the precision etching technique described herein also improves the accuracy at which the gate stack 217 can be overlapped with respect to the channel region 208.

Figure 18:
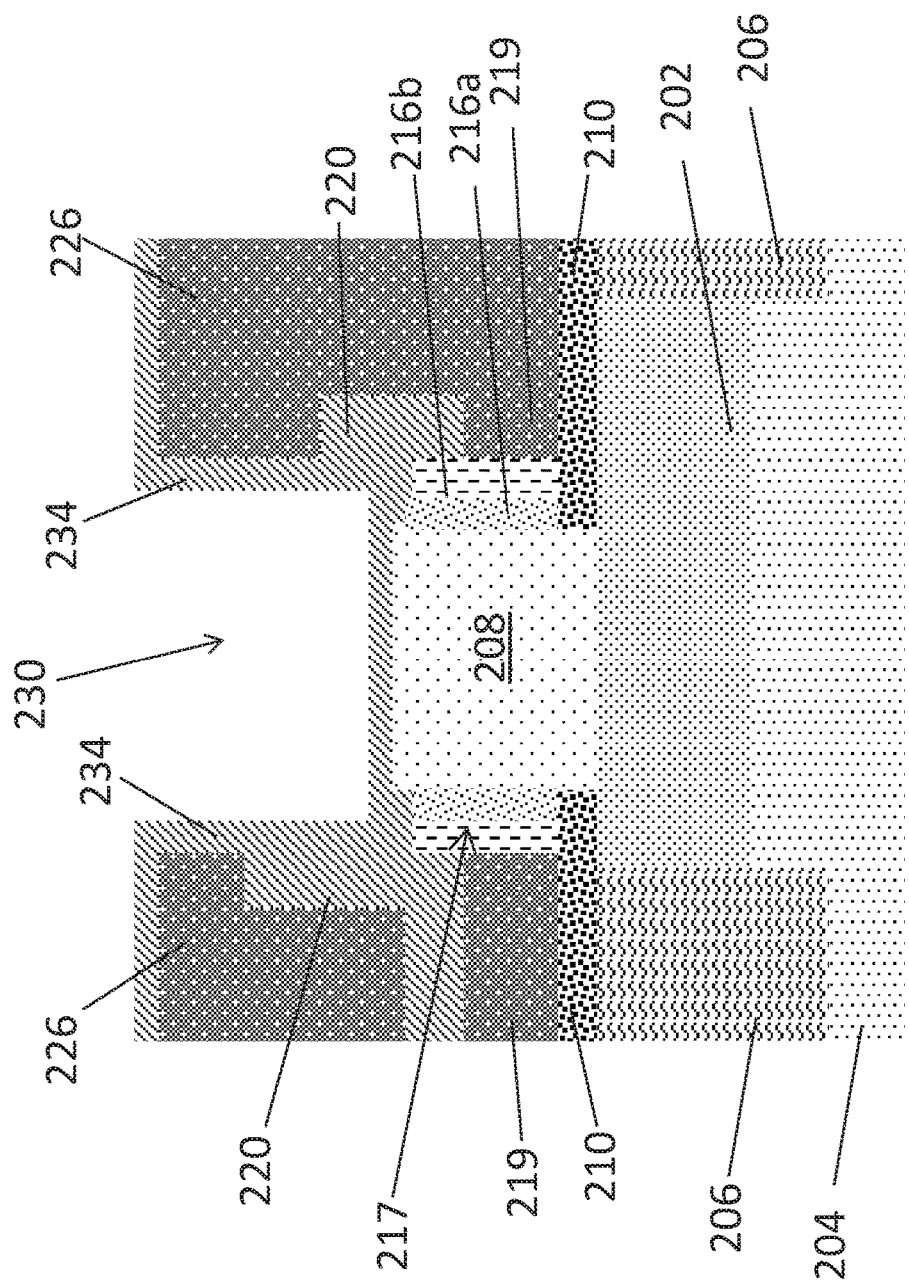
FIG. 18 illustrates the vertical FET shown in FIG. 17 following deposition of a second S/D spacers.

Turning now to FIG. 18, a gate dielectric liner 234 is deposited to line the sidewalls of the trench 230, along with filling the divots (previously indicated as numeral 232) and lining the upper surface of the channel region 208. The gate dielectric liner 234 can be composed of SiN, for example, and can be deposited using various deposition techniques including, but not limited to CVD and PECVD. The thickness of the gate dielectric liner 234 can range, for example, from about 3 nm to about 10 nm.

Figure 19:
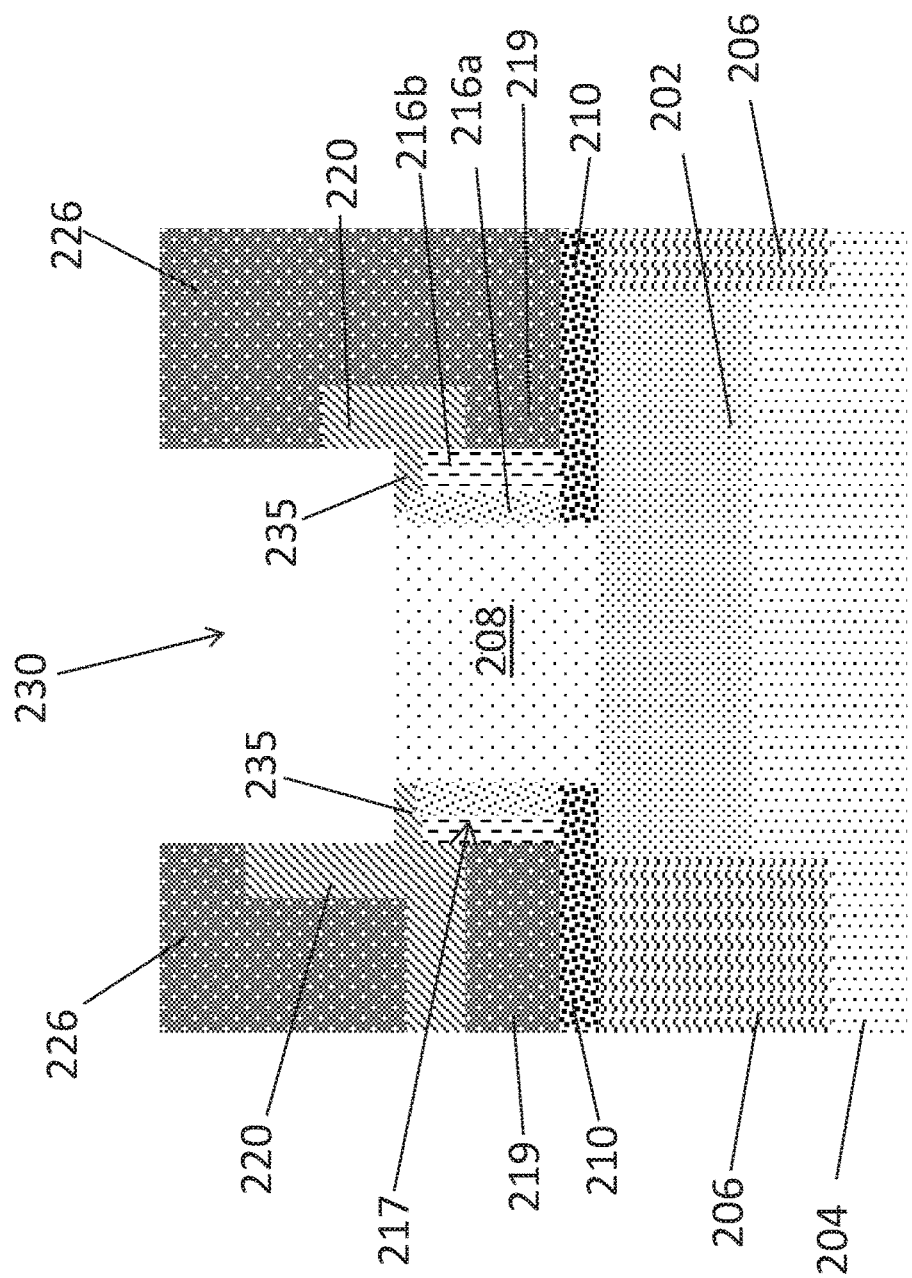
FIG. 19 illustrates the vertical FET shown in FIG. 18 after removing a portion of the second S/D spacers from the upper surface of the channel region and from the sidewalls of the ILD.

Referring to FIG. 19, a first portion of the gate dielectric liner 234 is removed following an etching process that stops on an upper surface of the channel region 208. Accordingly, the upper surface of the ILD 226, the sidewalls of the trench 230 and the upper surface of the channel region 208 are removed, while a second portion of the gate dielectric liner 234 remains filling the divots. In this manner, the remaining portion of the gate dielectric liner 234 forms dielectric gate elements 235 that insulate the gate stack 217 from the trench 230 while the channel region 208 is exposed. Because the process flow described herein forms the gate elements 235 by filling the divots defined by the shape of the gate stack 217, the gate elements 235 have the same thickness (e.g., extending along the X-axis), or substantially the same thickness, as the gate stack 217.

Figure 20:
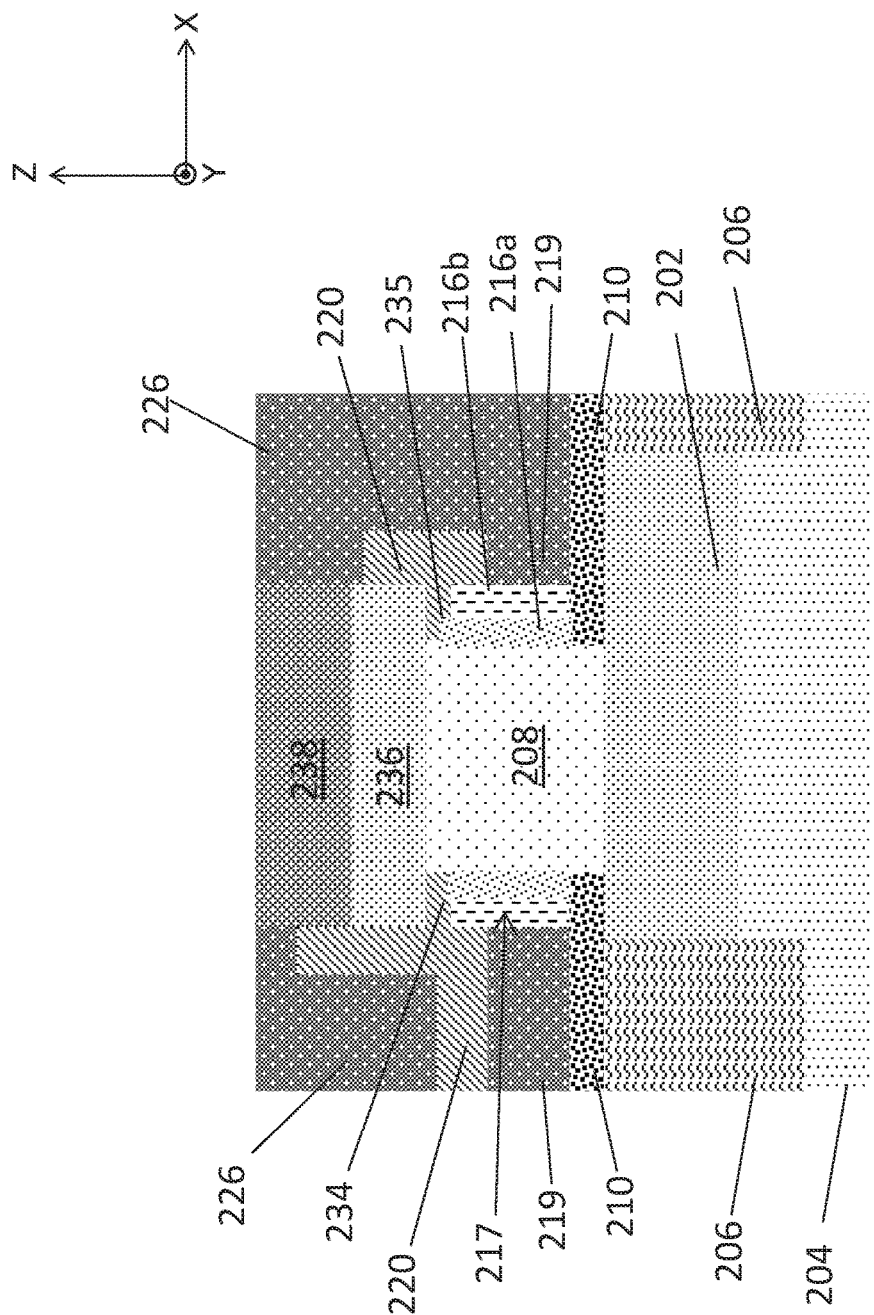
FIG. 20 illustrates the vertical FET shown in FIG. 19 following formation of an upper S/D region on the upper surface of the channel region and after forming a nitride cap that covers the upper S/D region.

Turning to FIG. 20, the vertical semiconductor device 200 is illustrated following formation of a second S/D region 236 (e.g., an upper S/D region 236) and a S/D hardmask cap 238. The upper S/D region 236 can be composed, for example, of Si, SiGe, SiC, InP, GaAs, the like, or a combination thereof. Accordingly, the upper S/D region 236 is vertically separated from the substrate 204 (e.g., along the Z-axis) via the channel region 208. That is, unlike planar-type semiconductor devices where both the first S/D region (e.g., the drain) and the second S/D region (e.g., the source) are in direct contact with the semiconductor substrate, the vertical-type semiconductor device 200 illustrated in FIG. 20 includes a first S/D region 204 that contacts the semiconductor substrate 204, and a second S/D region 236 that is separated from the semiconductor substrate 204 via the channel region 208 and the first S/D region 202. In this manner, the first S/D region 202 and the channel region 208 are interposed between the semiconductor substrate 204 and the second S/D region 236.

An epitaxy process can be performed to grow the upper S/D region 236 from the upper surface of the channel region 208. Various epitaxy processes can be performed including, but not limited to, a metal-organic CVD (MOCVD) epitaxy, molecular beam epitaxy (MBE), liquid phase epitaxy (LPE), vapor phase epitaxy (VPE), selective epitaxial growth (SEG), the like, or a combination thereof. The upper S/D region 236 can further be doped via in situ doping during growth and/or subsequent implantation. The dopants include, for example, boron, indium, or the like for a p-type transistor, and include, for example, phosphorus, arsenic, or the like for an n-type transistor.

Figure 21:
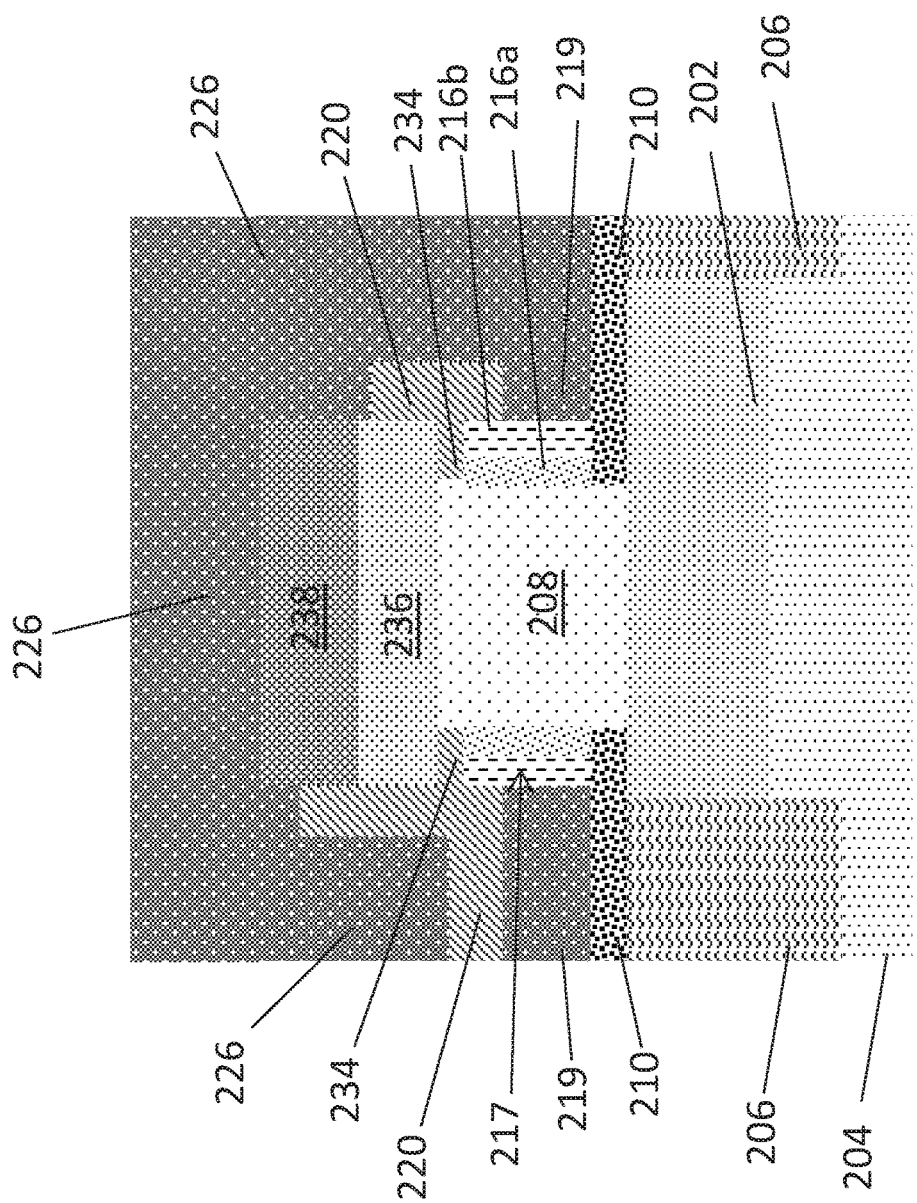
FIG. 21 illustrates the vertical FET shown in FIG. 20 after depositing additional ILD material over the upper S/D region to increase the height of the ILD.

The S/D hardmask cap 238 is formed on the upper surface of the upper S/D region 236. The S/D hardmask cap 238 is composed of a nitride material such as SiN, for example, and can be deposited using various deposition techniques including, but not limited to, ALD, CVD and PECVD. To provide the vertical semiconductor device 200 with a uniform upper surface, the S/D hardmask cap 238 can be blanket deposited over the ILD 226 to cover the upper S/D region 236, and a CMP process can be subsequently performed such that the upper surface of the ILD 226 is flush with the upper surface of the S/D hardmask cap 238. The uniform upper surface allows for improving the uniformity of an additional layer of ILD material that deposited over the initial ILD 226 and the S/D hardmask cap 238. In this manner, the height (e.g., extending along the Z-axis) of the ILD 226 is increased as illustrated in FIG. 21.

Figure 22:
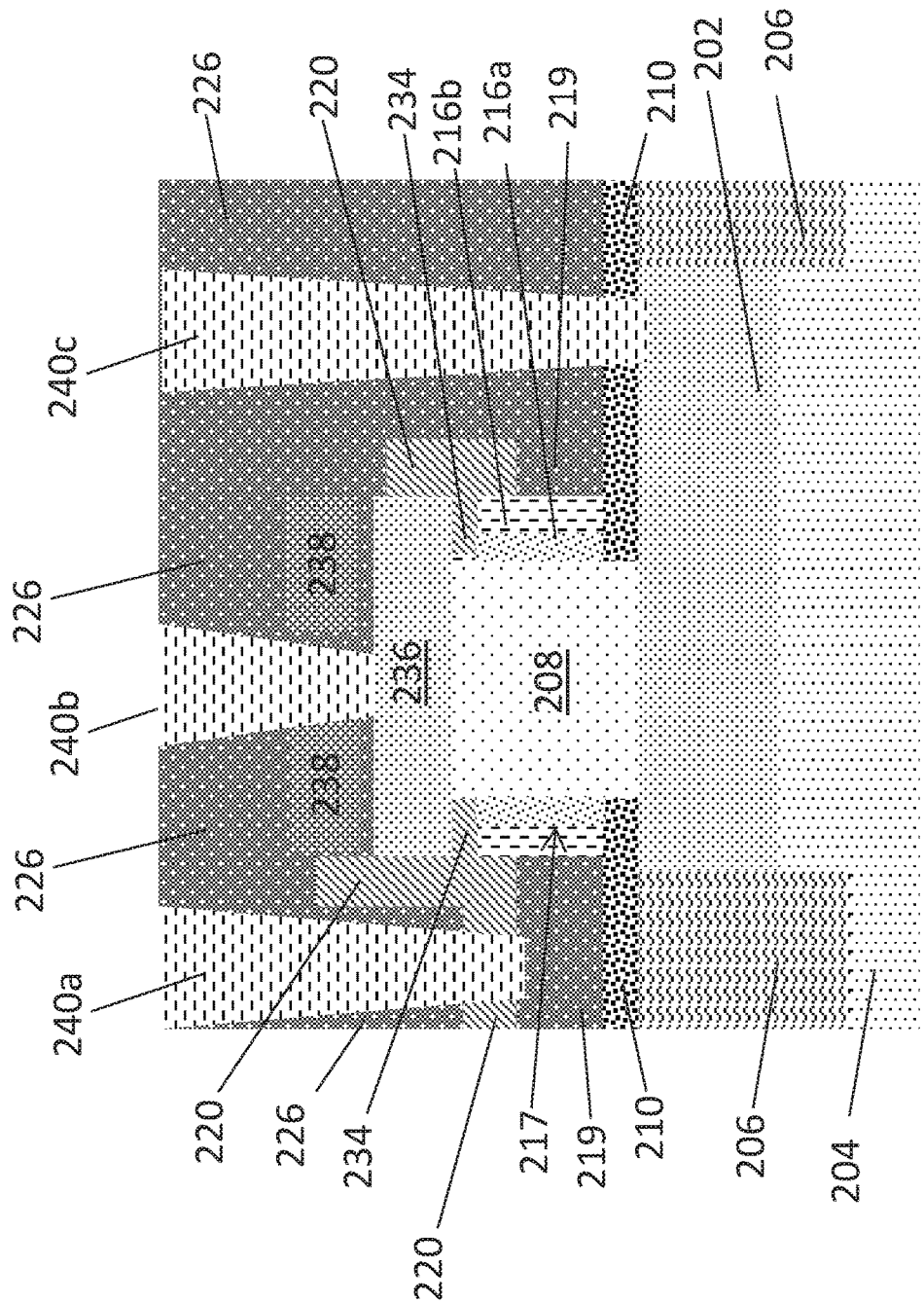
FIG. 22 illustrates the vertical FET shown in FIG. 21 following formation of electrically conductive vias.

With reference to FIG. 22, the vertical semiconductor device 200 is illustrated following one or more contact vias 240a-240c. For example, a first contact via 240a extends through ILD 226 and the gate spacer layer 220 to directly contact the gate contact 219. A second contact via 240b extends through the ILD 226 and the S/D hardmask cap 238 to directly contact the upper S/D region 236. A third contact via 240c extends through the ILD 226 and the lower S/D spacer 210 to directly contact the lower S/D region 202.

As described herein, various non-limiting embodiments provide a vertical-type semiconductor device (e.g., vertical FET) including a more precise gate length compared to conventional vertical-type semiconductor devices. The process flow for forming the vertical-type semiconductor device described herein provides an etch-back control stack 212, which when subsequently removed, defines a trench that defines access to the gate. An etching process can be performed to recess the height of the gate. Unlike conventional fabrication processes, however, the trench 230 defines a localized etching area which reduces the etching rate of the etching process. In this manner, the recess level of the gate can be more accurately controlled, thereby improving the precision of the gate length.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of controlling a gate length of a vertical-type semiconductor device, the method comprising:
    forming a semiconductor substrate including a first source/drain (S/D) region;
    forming a channel region over the S/D region;
    forming a sacrificial etch-back control stack on an upper surface of the channel region;
    forming a gate on sidewalls of the channel region and etch-back control stack, the gate defining a first gate length of the vertical-type semiconductor device;
    removing the sacrificial etch-back control stack to form a trench extending between inner sidewalls of the gate;
    performing a selective etching process that etches the gate while preserving the channel region to define a second gate length that is less than the first gate length; and
    forming a second S/D region on the upper surface of the channel region to form the vertical-type semiconductor device.

2. The method of claim 1, wherein forming the sacrificial etch-back control stack includes:
    forming an oxide layer on the upper surface of the channel region; and
    forming a sacrificial gate layer on an upper surface of the oxide layer.

3. The method of claim 2, wherein the oxide layer comprises silicon oxide ($SiO_2$), and the sacrificial gate layer comprises amorphous silicon.

4. The method of claim 1, further comprising:
    prior to removing the etch-back control stack, depositing a gate spacer that conforms to outer surfaces of the gate and the etch-back control stack,
    wherein the selective etching process recesses the gate below the channel region to define divots between inner walls of the gate spacer and the sidewalls of the channel region.

5. The method of claim 4, further comprising:
    after forming the trench, depositing a conformal gate dielectric liner that lines inner walls of the trench and the upper surface of the channel region while filling the divots; and
    subsequently performing a second selective etching process that removes a portion of the gate dielectric liner from the inner walls of the trench and the upper surface of the channel region such that remaining portions of the gate liner insulates the gate from the trench.

6. The method of claim 5, wherein the gate dielectric liner comprises a dielectric material.

7. The method of claim 6, wherein forming the second S/D region comprises epitaxially growing the second S/D region from the upper surface of the channel region, and wherein the remaining portions of the gate liner insulate the gate from the second S/D region.

8. A method of fabricating a vertical-type semiconductor device, the method comprising:
    forming a semiconductor substrate including a first source/drain (S/D) region, and forming a channel region over the S/D region;
    forming a sacrificial etch-back control stack on an upper surface of the channel region, and forming a hardmask cap over the sacrificial etch-back control stack;
    depositing an electrically conductive gate layer that conforms to outer surfaces of the channel region, etch-back control stack, and hardmask cap;
    performing a first etching process comprising a first etching chemistry that recesses the electrically conductive gate layer at a first etching rate to form an initial gate defining a first gate length;
    removing the sacrificial etch-back control stack and hardmask cap to form a trench extending between inner sidewalls of the gate;
    performing a second etching process comprising the first etching chemistry, the second etching process applied to the initial gate via the trench such that a localized etching area defined by the trench reduces an etching rate of the second etching process and the initial gate is recessed to define a second gate length that is less than the first gate length; and
    forming a second S/D region on the upper surface of the channel region to form the vertical-type semiconductor device.

9. The method of claim 8, wherein forming the sacrificial etch-back control stack includes:
    forming an oxide layer on the upper surface of the channel region; and
    forming a sacrificial gate layer on an upper surface of the oxide layer.

10. The method of claim 9, wherein the oxide layer comprises silicon oxide ($SiO_2$), and the sacrificial gate layer comprises amorphous silicon.

11. The method of claim 8, further comprising:
    prior to removing the etch-back control stack, depositing a gate spacer that conforms to the outer surfaces of the gate and the etch-back control stack,
    wherein a selective etching process recesses the gate below the channel region to define divots between inner walls of the gate spacer and sidewalls of the channel region.

12. The method of claim 11, further comprising:
    after forming the trench, depositing a conformal gate dielectric liner that lines inner walls of the trench and the upper surface of the channel region while filling the divots; and subsequently performing a second selective etching process that removes a portion of the gate dielectric liner from the inner walls of the trench and the upper surface of the channel region such that remaining portions of the gate liner insulates the gate from the trench.

13. The method of claim 12, wherein the gate dielectric liner comprises a dielectric material.

14. The method of claim 13, wherein forming the second S/D region comprises epitaxially growing the second S/D region from the upper surface of the channel region, and wherein the remaining portions of the gate liner insulate the gate from the second S/D region.

* * * * *